(12) United States Patent
Kim et al.

(10) Patent No.: US 12,369,324 B2
(45) Date of Patent: Jul. 22, 2025

(54) THREE-DIMENSIONAL SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: Seung Yoon Kim, Seoul (KR); Kanamori Kohji, Seongnam-si (KR); Jeehoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 636 days.

(21) Appl. No.: 17/842,878

(22) Filed: Jun. 17, 2022

(65) Prior Publication Data

US 2023/0134878 A1    May 4, 2023

(30) Foreign Application Priority Data

Oct. 28, 2021  (KR) .................. 10-2021-0145472

(51) Int. Cl.
*H10B 43/50* (2023.01)
*H01L 23/535* (2006.01)
*H10B 43/27* (2023.01)
*H10B 43/40* (2023.01)

(52) U.S. Cl.
CPC ........... *H10B 43/50* (2023.02); *H01L 23/535* (2013.01); *H10B 43/27* (2023.02); *H10B 43/40* (2023.02)

(58) Field of Classification Search
CPC ........ H10B 43/27; H10B 43/40; H10B 43/50; H10B 63/34; H10B 63/84; H10B 63/845; H10B 80/00; H10N 70/20; H10N 70/8265; H10N 70/8833; H01L 24/08; H01L 25/0657; H01L 25/18; H01L 25/50
See application file for complete search history.

(56) References Cited

U.S. PATENT DOCUMENTS

| | | |
|---|---|---|
| 8,431,969 B2 | 4/2013 | Kim et al. |
| 9,818,759 B2 | 11/2017 | Kai et al. |
| 9,887,097 B2 | 2/2018 | Hudson |
| 9,893,077 B2 | 2/2018 | Nam et al. |
| 10,431,593 B2 | 10/2019 | Yun et al. |
| 10,923,495 B2 | 2/2021 | Kim et al. |
| 10,978,465 B2 | 4/2021 | Lee et al. |

(Continued)

FOREIGN PATENT DOCUMENTS

| | | |
|---|---|---|
| KR | 20160143982 A | 12/2016 |
| KR | 101702060 B1 | 2/2017 |

(Continued)

*Primary Examiner* — Brook Kebede
(74) *Attorney, Agent, or Firm* — Myers Bigel, P.A.

(57) ABSTRACT

A three-dimensional semiconductor memory device includes a substrate, and a stack structure on the substrate. The stack structure includes first blocks that extend in a first direction and are arranged in a second direction intersecting the first direction, and a second block that is between the first blocks; separation structures that extend in the first direction and are arranged in the second direction between the first blocks and between the first and second blocks; vertical channel structures that penetrate the first blocks and contact the substrate; and through-via structures that penetrate the second block and the substrate. A width of each of the first blocks in the second direction is equal to a width of the second block in the second direction.

20 Claims, 18 Drawing Sheets

(56) References Cited

U.S. PATENT DOCUMENTS

| | | | |
|---|---|---|---|
| 11,152,387 B2 | 10/2021 | Lim | |
| 2015/0372005 A1* | 12/2015 | Yon | H10B 41/27 |
| | | | 257/314 |
| 2016/0163732 A1* | 6/2016 | Lim | H10B 43/27 |
| | | | 257/314 |
| 2016/0307632 A1* | 10/2016 | Lee | H01L 23/53271 |
| 2020/0194453 A1* | 6/2020 | Lim | H10B 43/10 |
| 2021/0096967 A1 | 4/2021 | Choi et al. | |

FOREIGN PATENT DOCUMENTS

| | | |
|---|---|---|
| KR | 20190001637 A | 1/2019 |
| KR | 20190132080 A | 11/2019 |
| KR | 20200007220 A | 1/2020 |
| KR | 20200073702 A | 6/2020 |
| KR | 102156104 B1 | 9/2020 |
| KR | 20210037367 A | 4/2021 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0145472, filed on Oct. 28, 2021, in the Korean Intellectual Property Office, the entire contents of which are hereby incorporated by reference.

FIELD

The present disclosure relates to a three-dimensional semiconductor memory device and an electronic system therewith, and in particular, to a nonvolatile three-dimensional semiconductor memory device including a vertical channel structure, a method of fabricating the same, and an electronic system including the same.

BACKGROUND

A semiconductor device capable of storing a large amount of data may be required for data storage in an electronic system. Higher integration of semiconductor devices may be required to satisfy consumer demand for high data storage capacity, superior performance, and low cost. In the case of two-dimensional or planar semiconductor devices, since their integration is largely determined by the area occupied by a unit memory cell, integration may be greatly influenced by the level of a fine pattern forming technology. However, expensive process equipment may be needed to increase pattern fineness, and may set practical limitations on increasing integration for two-dimensional or planar semiconductor devices. Thus, three-dimensional semiconductor memory devices including three-dimensionally arranged memory cells have been proposed.

SUMMARY

An embodiment of the inventive concept provides a three-dimensional semiconductor memory device with improved electrical characteristics and reliability and a method capable of simplifying a process of fabricating a three-dimensional semiconductor memory device.

An embodiment of the inventive concept provides an electronic system including the three-dimensional semiconductor memory device.

According to an embodiment of the inventive concept, a three-dimensional semiconductor memory device may include a substrate; a stack structure on the substrate, where the stack structure includes first blocks that extend in a first direction and are arranged in a second direction intersecting the first direction, and a second block that is provided between the first blocks; separation structures that extend in the first direction and are arranged in the second direction between the first blocks and between the first and second blocks; vertical channel structures that penetrate the first blocks and contact the substrate; and through-via structures that penetrate the second block and the substrate. A width of each of the first blocks in the second direction may be equal to a width of the second block in the second direction.

According to an embodiment of the inventive concept, a three-dimensional semiconductor memory device may include a first substrate; a peripheral circuit structure including peripheral circuit transistors on the first substrate; a second substrate on the peripheral circuit structure; a stack structure on the second substrate, the stack structure including first blocks that extend in a first direction and are arranged in a second direction intersecting the first direction, and a second block that is between the first blocks; first separation structures that extend in the first direction and are arranged in the second direction between the first blocks and between the first and second blocks; second separation structures that cross an inner portion of each of the first blocks in the first direction; vertical channel structures that are in vertical channel holes penetrating the first blocks and contact the second substrate; through-via structures that penetrate the second block and the second substrate and are electrically connected to respective ones of the peripheral circuit transistors; through-via spacers that extend around the through-via structures; and bit lines that are electrically connected to the vertical channel structures and the through-via structures. The first separation structures in the stack structure may have a uniform pitch, and the second block may be spaced apart from the second separation structures in the second direction.

According to an embodiment of the inventive concept, an electronic system may include a three-dimensional semiconductor memory device, and a controller electrically connected to the three-dimensional semiconductor memory device and configured to control the three-dimensional semiconductor memory device. The three-dimensional semiconductor memory device may include a substrate; a stack structure on the substrate, the stack structure including first blocks that extend in a first direction and are arranged in a second direction intersecting the first direction, and a second block that is between the first blocks; separation structures that extend in the first direction and are arranged in the second direction between the first blocks and between the first and second blocks; vertical channel structures that penetrate the first blocks and contact the substrate; through-via structures that penetrate the second block and the substrate; and an input/output pad on the stack structure. The controller may be electrically connected to the three-dimensional semiconductor memory device through the input/output pad, and a width of each of the first blocks in the second direction may be equal to a width of the second block in the second direction.

DETAILED DESCRIPTION

Example embodiments of the inventive concepts will now be described more fully with reference to the accompanying drawings, in which example embodiments are shown.

Figure 1:
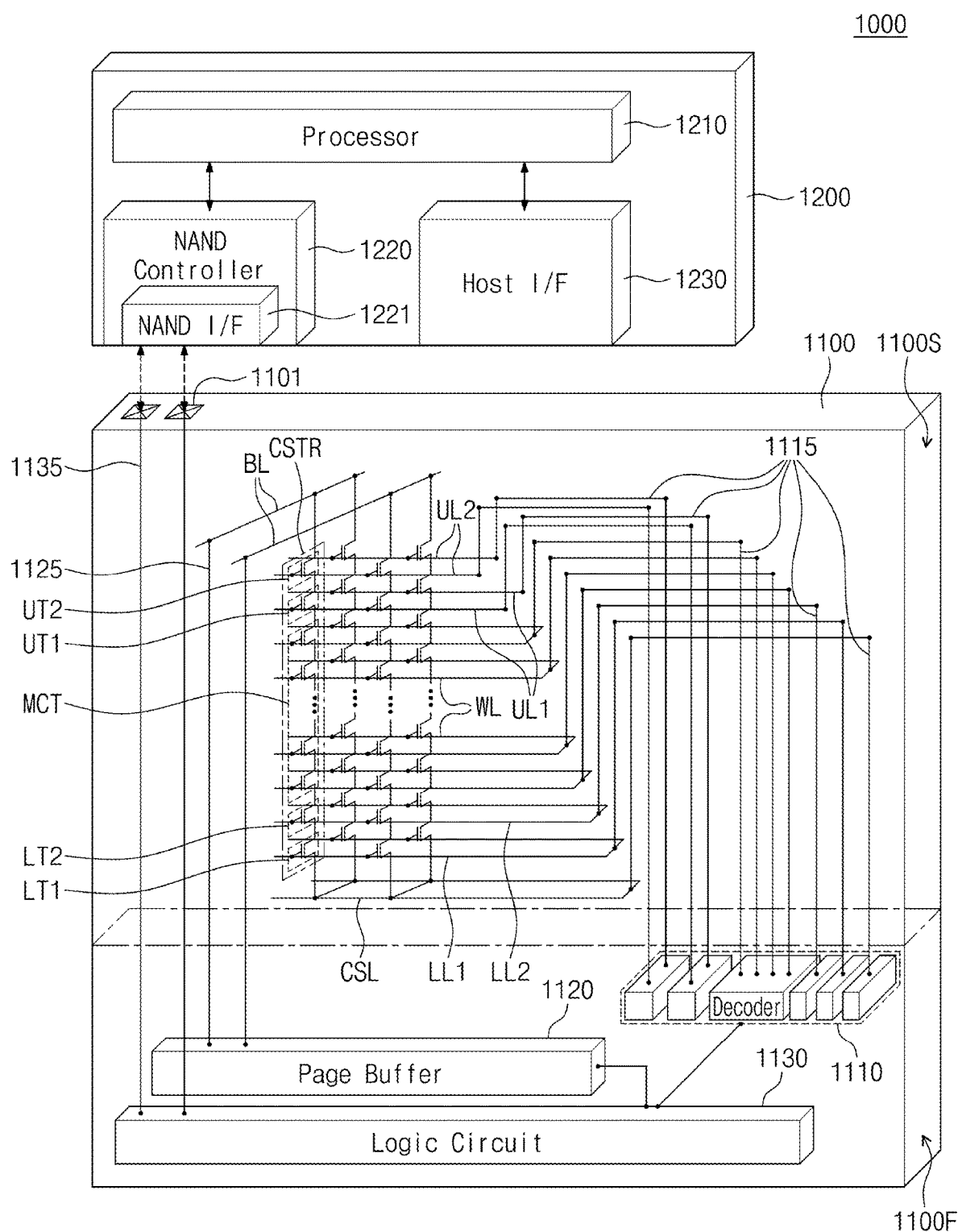
FIG. 1 is a schematic diagram illustrating an electronic system including a three-dimensional semiconductor memory device according to an embodiment of the inventive concept.

FIG. 1 is a schematic diagram illustrating an electronic system including a three-dimensional semiconductor memory device according to an embodiment of the inventive concept.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including such a storage device. For example, the electronic system 1000 may be a solid state drive (SSD) device, a universal serial bus (USB), a computing system, a medical system, or a communication system, in which at least one three-dimensional semiconductor memory device 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. The terms first, second, third, etc. may be used herein merely to differentiate one element, layer, or region from another. In an embodiment, the first region 1100F may be disposed beside the second region 1100S. The first region 1100F may be a peripheral circuit region, which includes a decoder circuit 1110, a page buffer 1120, and a logic circuit 1130. The second region 1100S may be a memory cell region, which includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to embodiments.

In an embodiment, the first transistors LT1 and LT2 may include a ground selection transistor, and the second transistors UT1 and UT2 may include a string selection transistor. The first lines LL1 and LL2 may be used as gate electrodes of the first transistors LT1 and LT2, respectively. The word lines WL may be used as gate electrodes of the memory cell transistors MCT. The second lines UL1 and UL2 may be used as gate electrodes of the second transistors UT1 and UT2, respectively.

In an embodiment, the first transistors LT1 and LT2 may include a first erase control transistor LT1 and a ground selection transistor LT2, which are connected in series. The second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which extend from the first region 1100F to the second region 1100S. The bit line BL may be electrically connected to the page buffer 1120 through second interconnection lines 1125, which extend from the first region 1100F to the second region 1100S.

In the first region 1100F, the decoder circuit 1110 and the page buffer 1120 may be configured to perform a control operation, which is performed on at least one memory cell transistor selected from the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which extends from the first region 1100F to the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control the plurality of three-dimensional semiconductor memory devices 1100.

The processor 1210 may control overall operations of the electronic system 1000 including the controller 1200. Based on a specific firmware, the processor 1210 may execute operations of controlling the NAND controller 1220 and accessing to the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands, which are used to control the three-dimensional semiconductor memory device 1100, data, which will be written in or read from the memory cell transistors MCT of the three-dimensional semiconductor memory device 1100, and so forth. The host interface 1230 may be configured to allow for communication between the electronic system 1000 and an external host. In some embodiments, the processor 1210 may control the three-dimensional semiconductor memory device 1100 if a control command is provided from an external host through the host interface 1230.

Figure 2:
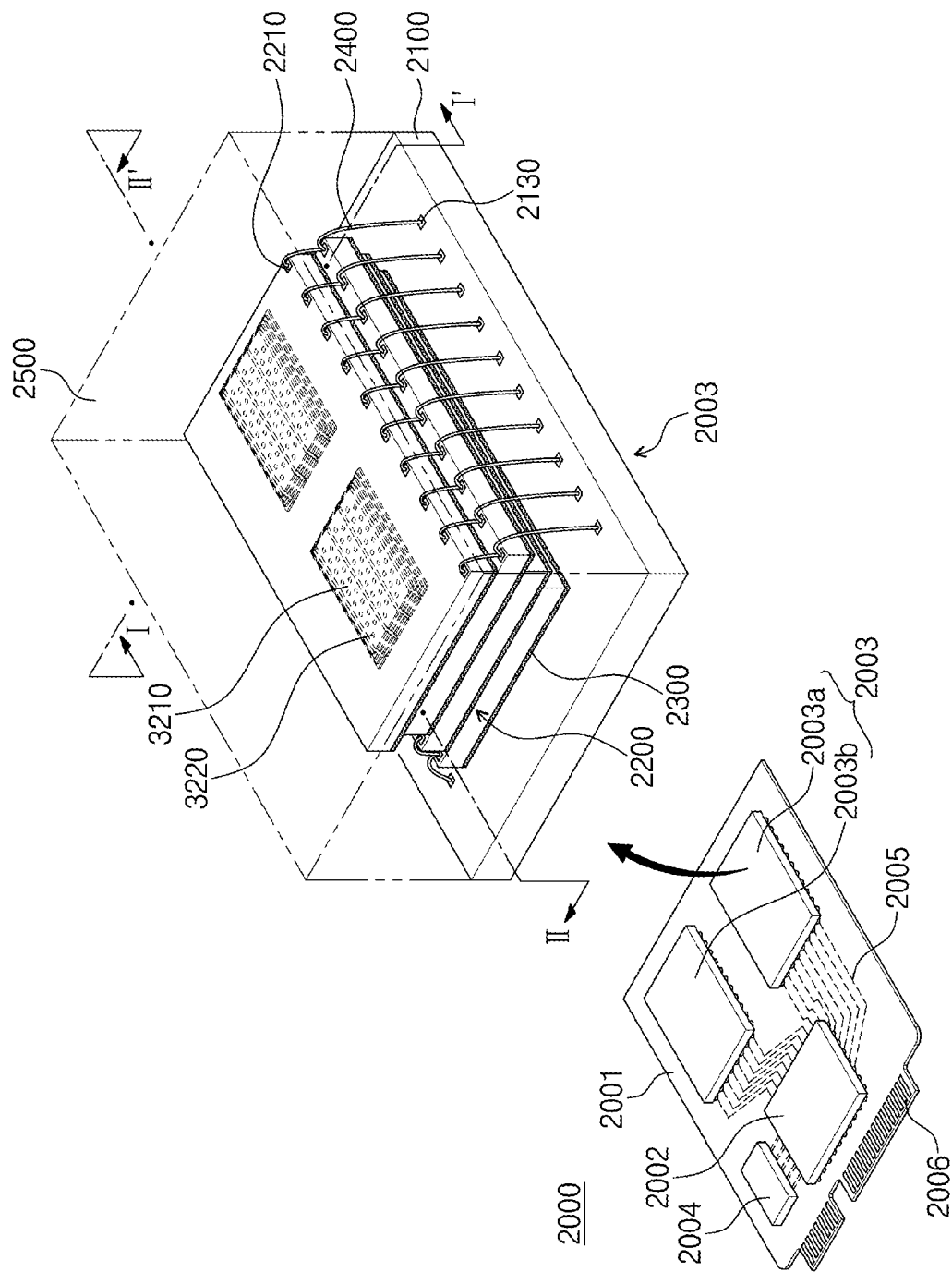
FIG. 2 is a perspective view schematically illustrating an electronic system including a three-dimensional semiconductor memory device according to an embodiment of the inventive concept.

FIG. 2 is a perspective view schematically illustrating an electronic system including a three-dimensional semiconductor memory device according to an embodiment of the inventive concept.

Referring to FIG. 2, an electronic system 2000 may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins configured to be coupled to an external host. In the connector 2006, the number and the arrangement of the pins may be changed depending on a communication interface between the electronic system 2000 and the external host. In an embodiment, the electronic system 2000 may communicate with the external host, in accordance with one or more interfaces, such as universal serial bus (USB), peripheral component interconnect express (PCI-Express), serial advanced technology attachment (SATA), universal flash storage (UFS) M-PHY, or the like. In an embodiment, the electronic system 2000 may be driven by an electric power, which is supplied from the external host through the connector 2006. The electronic system 2000 may further include a power management integrated circuit (PMIC) that is used to separately supply electric power, which is provided from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by or to otherwise account for a difference in speed between the semiconductor package 2003, which serves as a data storage device, and an external host. In an embodiment, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b*, which are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device, which will be described below.

In an embodiment, the connection structure 2400 may be a bonding wire electrically connecting the input/output pads 2210 to the package upper pads 2130. In each of the first and second semiconductor packages 2003*a* and 2003*b*, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003*a* and 2003*b* may be electrically connected to each other by through silicon vias (TSVs), instead of or in addition to the connection structure 2400 provided in the form of bonding wires.

In an embodiment, the controller 2002 and the semiconductor chips 2200 may be included in a single package. For example, the controller 2002 and the semiconductor chips 2200 may be mounted on an interposer substrate, which is prepared independent of the main substrate 2001, and may be connected to each other through interconnection lines, which are provided in the interposer substrate.

Figure 3:
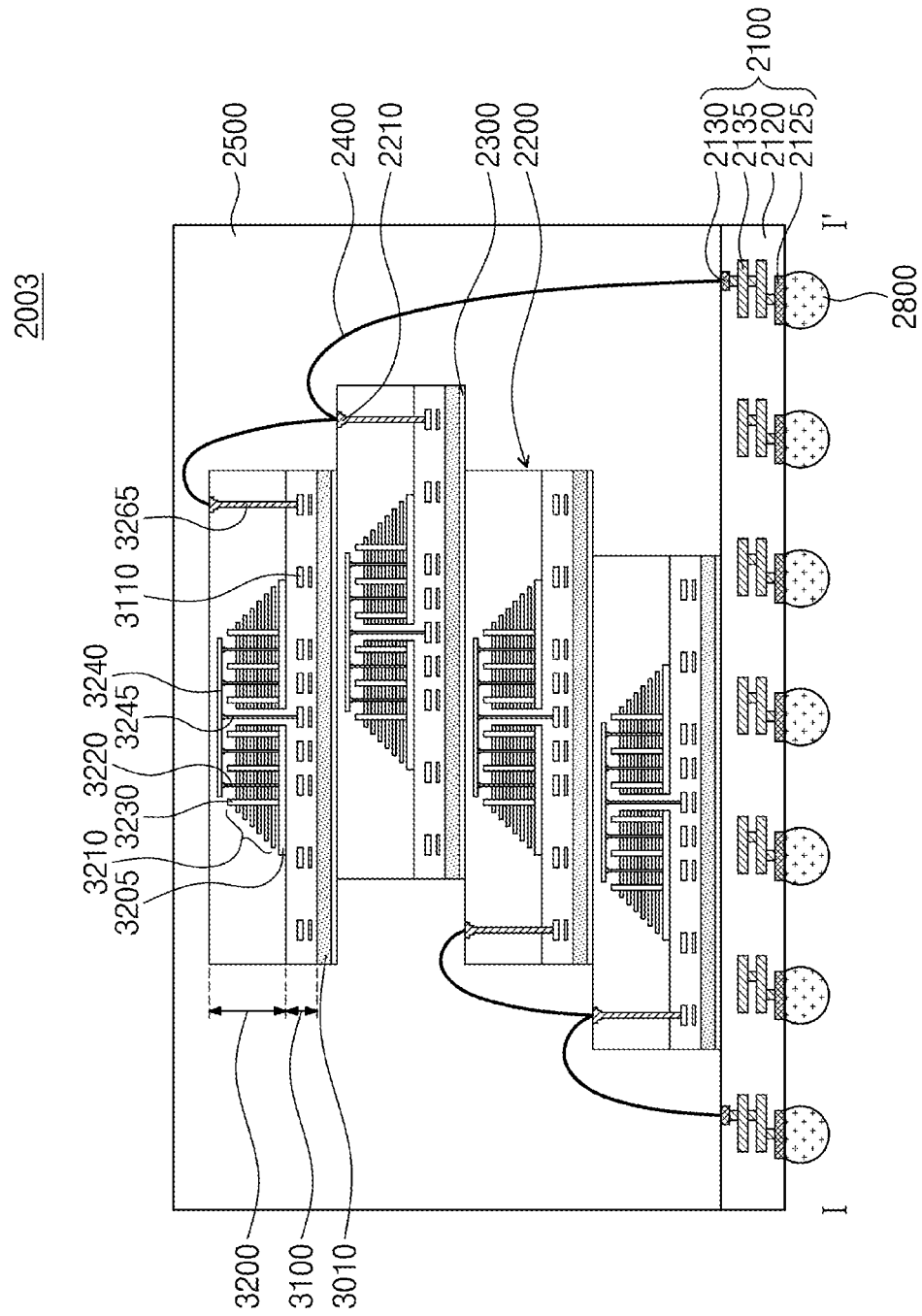
FIGS. 3 and 4 are sectional views, which are taken along lines I-I' and II-IF of FIG. 2, respectively, to illustrate a semiconductor package including a three-dimensional semiconductor memory device according to an embodiment of the inventive concept.
Figure 4:
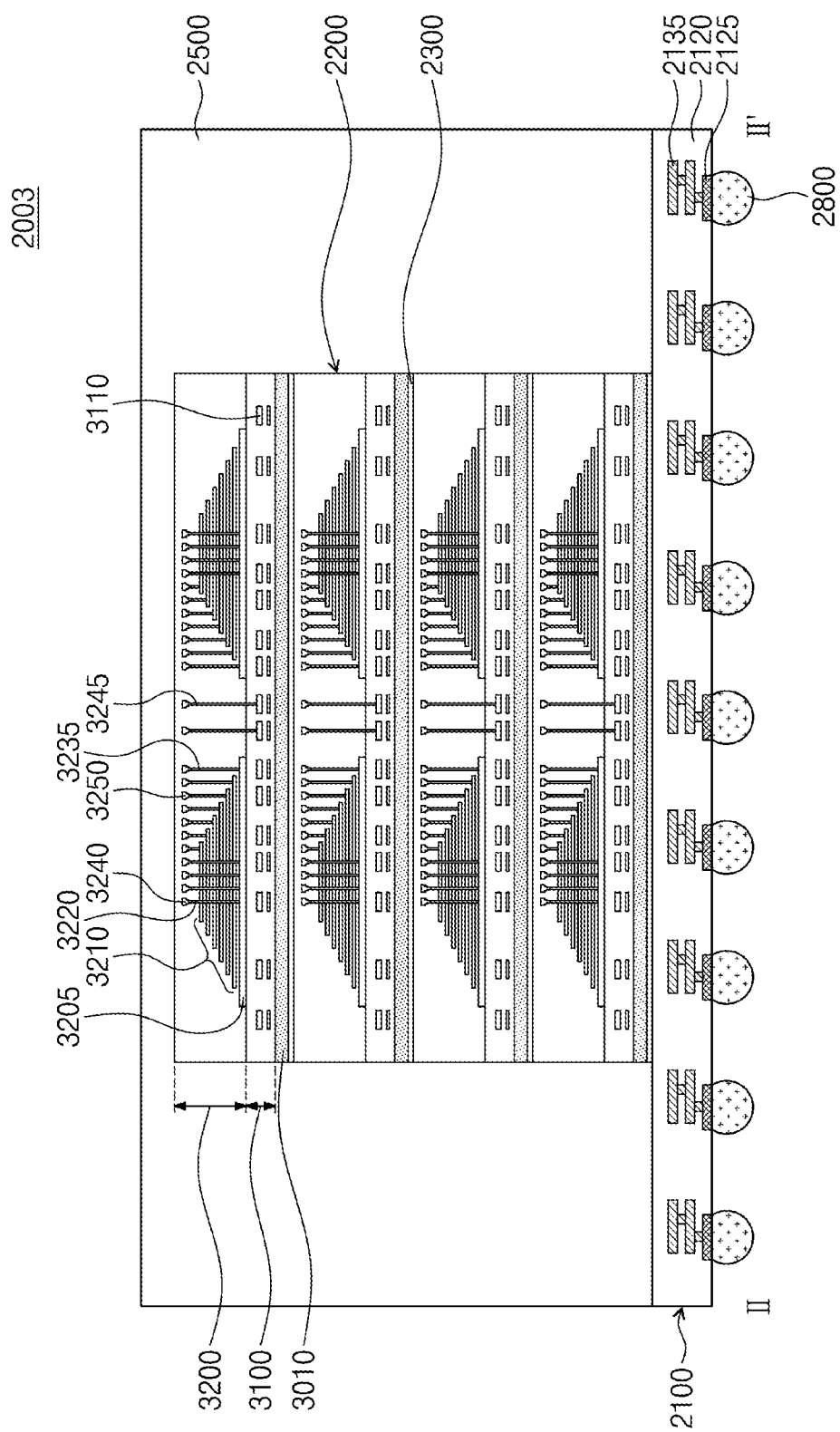

FIGS. 3 and 4 are sectional views, which are taken along lines I-I' and II-II' of FIG. 2, respectively, to illustrate a semiconductor package including a three-dimensional semiconductor memory device according to an embodiment of the inventive concept.

Referring to FIGS. 3 and 4, the semiconductor package 2003 may include the package substrate 2100, a plurality of semiconductor chips on the package substrate 2100, and the molding layer 2500 covering the package substrate 2100 and the semiconductor chips.

The package substrate 2100 may include a package substrate body portion 2120, the package upper pads 2130 disposed on a top surface of the package substrate body portion 2120, lower pads 2125 disposed on or exposed through a bottom surface of the package substrate body portion 2120, and internal lines 2135 provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 of FIG. 2 through conductive connecting portions 2800.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a common source line 3205, a gate stack structure 3210 on the common source line 3205, vertical channel structures 3220 and separation structures 3230 penetrating the gate stack structure 3210, bit lines 3240 electrically connected to the vertical channel structures 3220, gate interconnection lines 3235 electrically connected to word lines (e.g., WL of FIG. 1) of the gate stack structure 3210, and conductive lines 3250. Each of the gate interconnection lines 3235 may be electrically connected to a corresponding one of the word lines WL. At least one of the gate interconnection lines 3235 may be electrically connected to the common source line 3205.

Each of the semiconductor chips 2200 may include penetration lines 3245, which are electrically connected to the peripheral lines 3110 of the first structure 3100 and extend into the second structure 3200. The penetration line 3245 may be provided to penetrate the gate stack structure 3210, and in an embodiment, the penetration line 3245 may be further disposed outside the gate stack structure 3210. Each of the semiconductor chips 2200 may further include an input/output interconnection line 3265, which extends into the second structure 3200 and is electrically connected to the peripheral line 3110 of the first structure 3100, and the input/output pad 2210, which is electrically connected to the input/output interconnection line 3265.

Figure 5A:
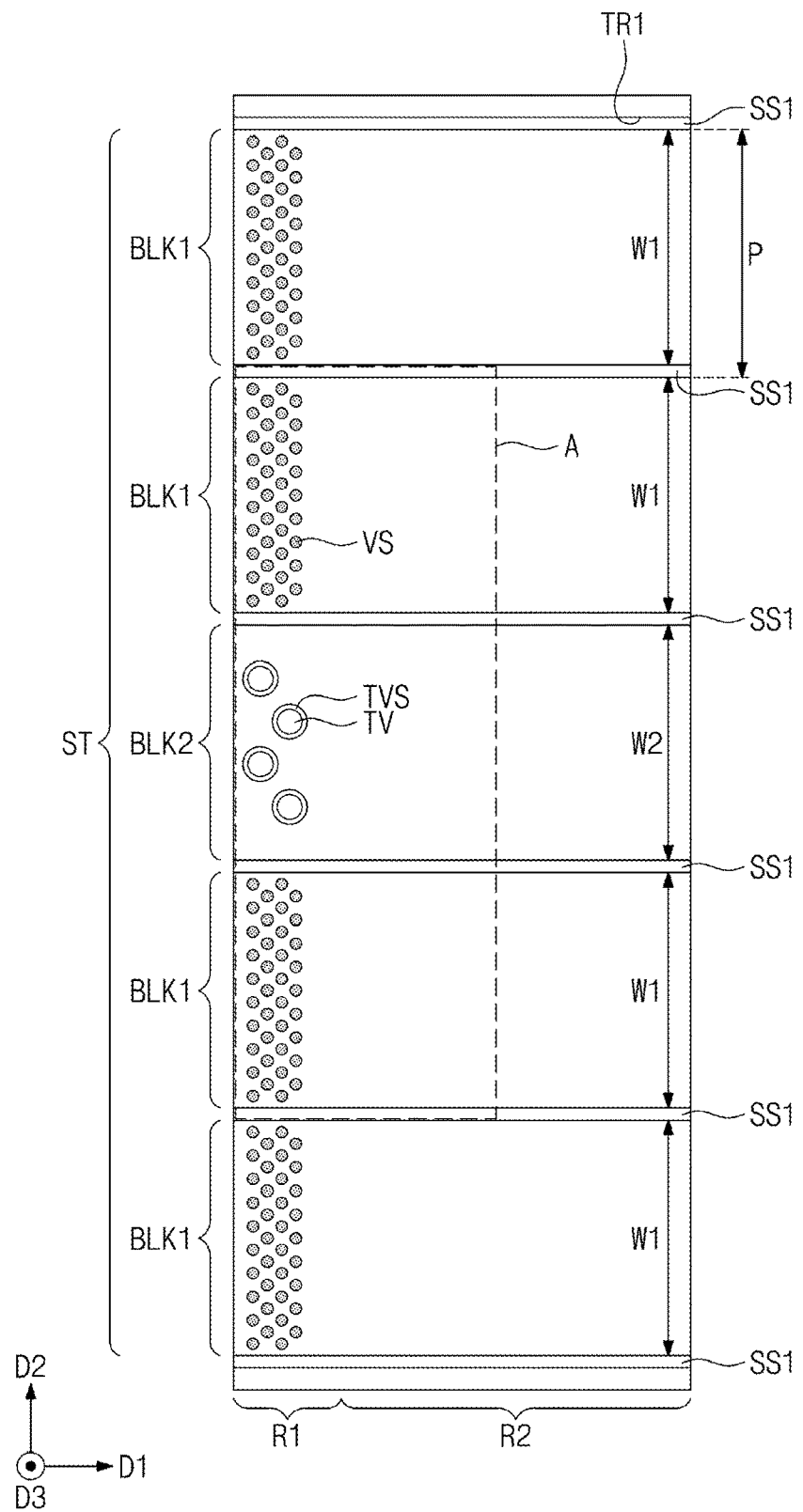
FIGS. 5A and 5B are plan views illustrating a three-dimensional semiconductor memory device according to an embodiment of the inventive concept.
Figure 5B:
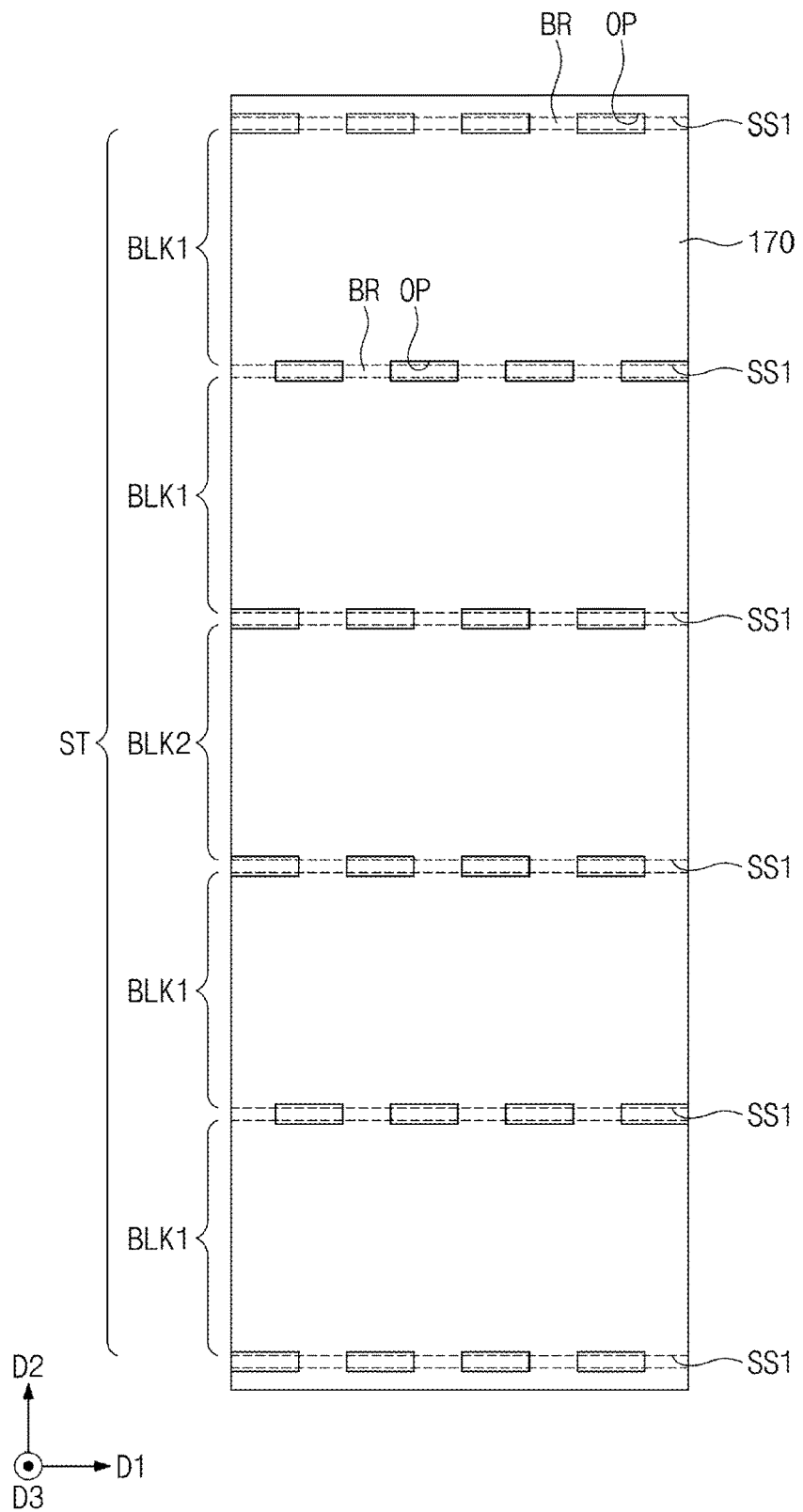
Figure 6:
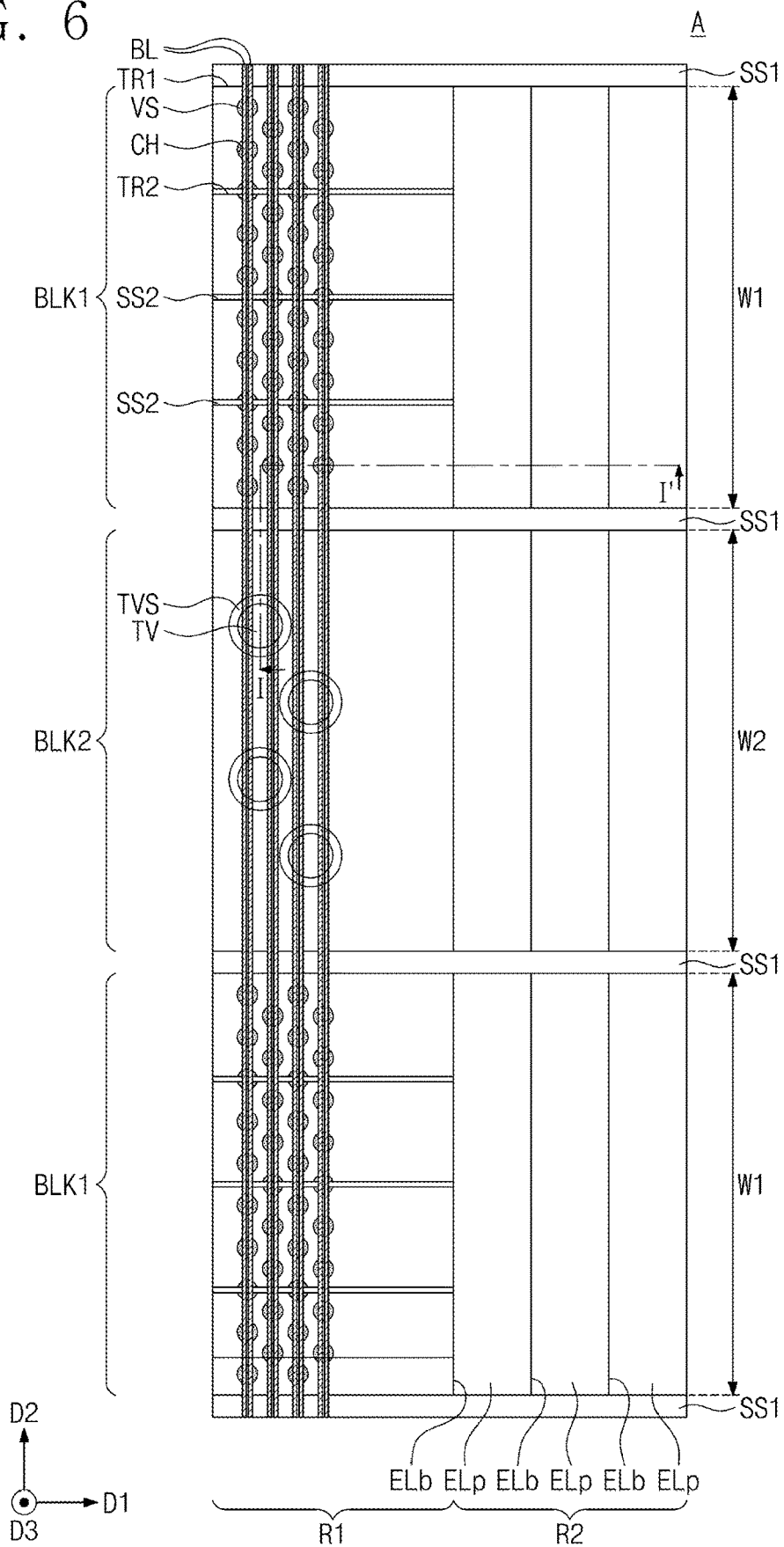
FIG. 6 is an enlarged plan view illustrating a portion (e.g., A of FIG. 5A) of a three-dimensional semiconductor memory device according to an embodiment of the inventive concept.
Figure 7A:
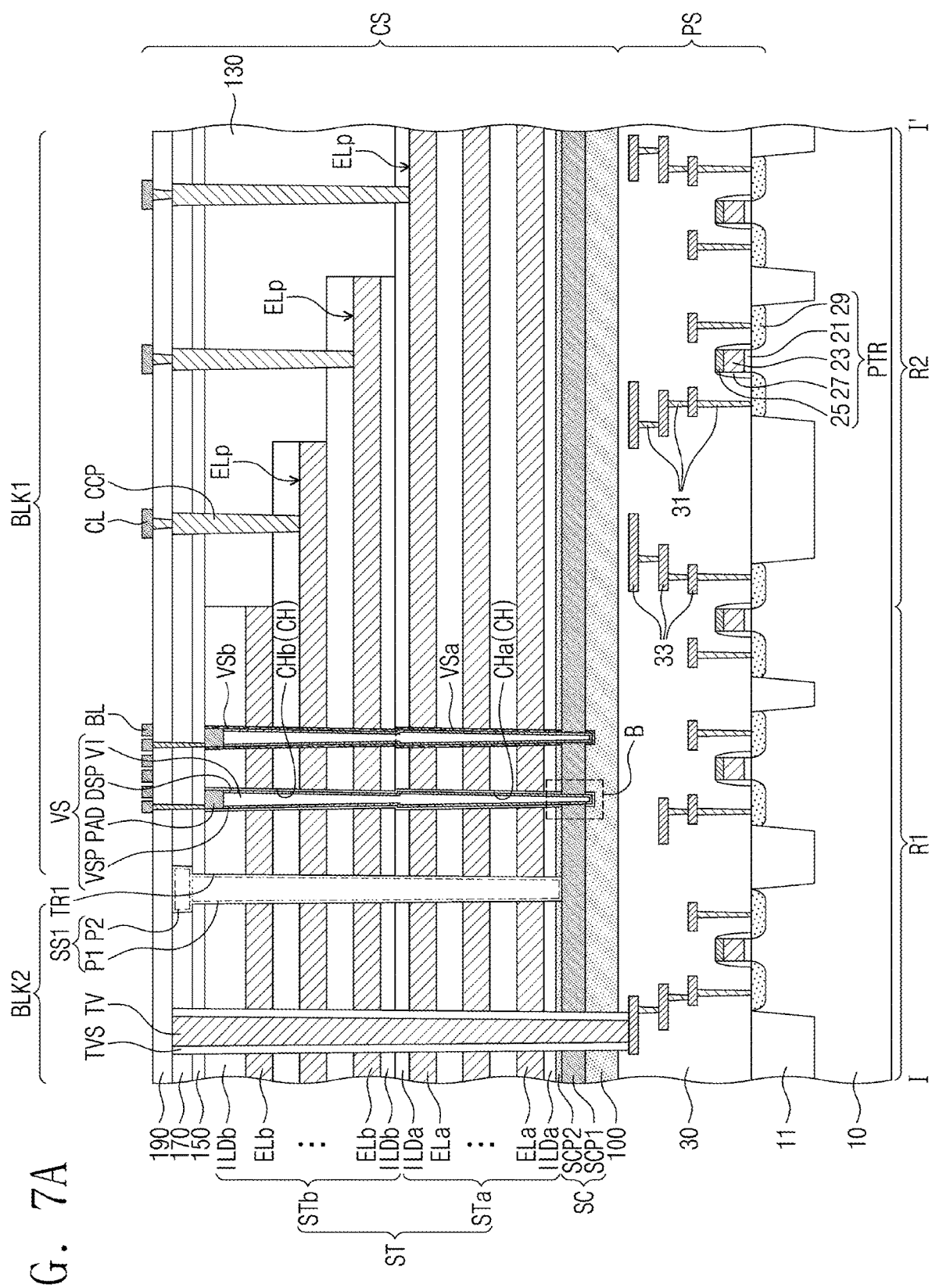
FIGS. 7A and 7B are sectional views, which are respectively taken along a line I-I' of FIG. 6 to illustrate a three-dimensional semiconductor memory device according to an embodiment of the inventive concept.
Figure 7B:
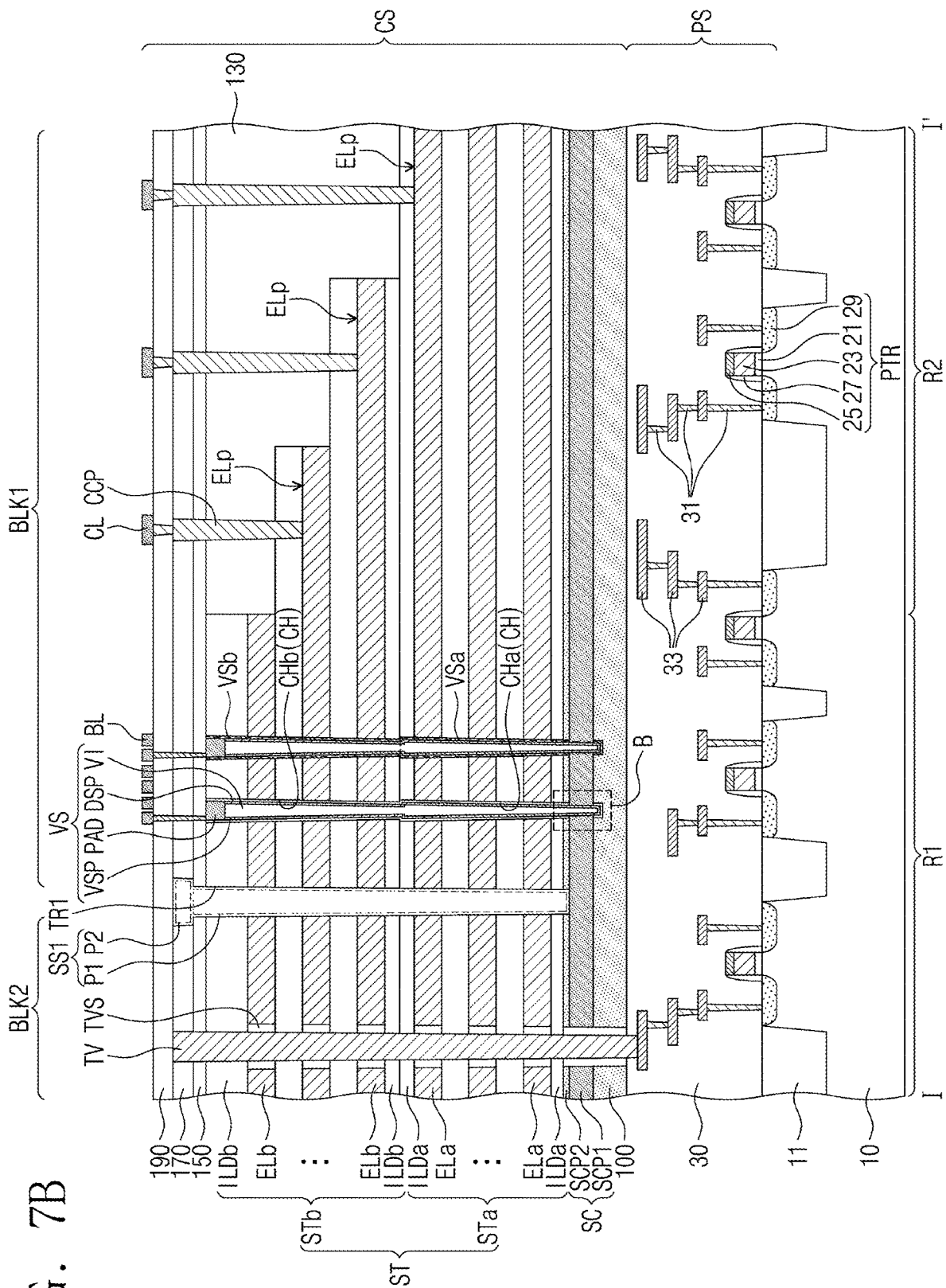

FIGS. 5A and 5B are plan views illustrating a three-dimensional semiconductor memory device according to an embodiment of the inventive concept. FIG. 6 is an enlarged plan view illustrating a portion (e.g., A of FIG. 5A) of a three-dimensional semiconductor memory device according to an embodiment of the inventive concept. FIGS. 7A and 7B are sectional views, which are respectively taken along a line I-I' of FIG. 6 to illustrate a three-dimensional semiconductor memory device according to an embodiment of the inventive concept.

Referring to FIGS. 5A, 5B, 6, and 7A, a first substrate 10 including a first region R1 and a second region R2 may be provided. The first substrate 10 may extend in a first direction D1, which is oriented from the first region R1 toward the second region R2, and in a second direction D2, which is not parallel to the first direction D1. A top surface of the first substrate 10 may be perpendicular to a third direction D3, which is not parallel to the first and second directions D1 and D2. For example, the first direction D1, the second direction D2, and the third direction D3 may be orthogonal to each other.

The second region R2 may extend from the first region R1 in the first direction D1. The first region R1 may be a region, in which the vertical channel structures 3220, the separation structures 3230, and the bit lines 3240 described with reference to FIGS. 3 and 4 are provided. The second region R2 may be a region, in which a staircase structure including pad portions ELp to be described below is provided.

In an embodiment, the first substrate 10 may be a silicon substrate, a silicon germanium substrate, a germanium substrate, or a structure including a single-crystalline silicon substrate and a single-crystalline epitaxial layer grown therefrom. A device isolation layer 11 may be provided in the first substrate 10. The device isolation layer 11 may define an active region of the first substrate 10. The device isolation layer 11 may be formed of or include, for example, silicon oxide.

A peripheral circuit structure PS may be provided on the first substrate 10. The peripheral circuit structure PS may include peripheral circuit transistors PTR on the active region of the first substrate 10, peripheral circuit contact plugs 31, peripheral circuit lines 33 electrically connected to the peripheral circuit transistors PTR through the peripheral circuit contact plugs 31, and a first insulating layer 30 enclosing them. The peripheral circuit structure PS may correspond to the first region 1100F of FIG. 1, and the peripheral circuit lines 33 may correspond to the peripheral lines 3110 of FIGS. 3 and 4.

The peripheral circuit transistors PTR, the peripheral circuit contact plugs 31, and the peripheral circuit lines 33 may constitute a peripheral circuit. For example, the peripheral circuit transistors PTR may constitute the decoder circuit 1110, the page buffer 1120, and the logic circuit 1130 of FIG. 1. More specifically, each of the peripheral circuit transistors PTR may include a peripheral gate insulating layer 21, a peripheral gate electrode 23, a peripheral capping pattern 25, a peripheral gate spacer 27, and peripheral source/drain regions 29.

The peripheral gate insulating layer 21 may be provided between the peripheral gate electrode 23 and the first substrate 10. The peripheral capping pattern 25 may be provided on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be provided in portions of the first substrate 10, which are located at both sides of the peripheral gate electrode 23.

The peripheral circuit lines 33 may be electrically connected to the peripheral circuit transistors PTR through the peripheral circuit contact plugs 31. Each of the peripheral circuit transistors PTR may be an NMOS transistor or a PMOS transistor and, in an embodiment, may be a gate-all-around type transistor. In an embodiment, as a distance from the first substrate 10 increases, widths of the peripheral circuit contact plugs 31 may increase. The peripheral circuit contact plugs 31 and the peripheral circuit lines 33 may be formed of or include at least one of conductive (e.g., metallic) materials.

The first insulating layer 30 may be provided on the top surface of the first substrate 10. The first insulating layer 30 may be provided on the first substrate 10 to cover the peripheral circuit transistors PTR, the peripheral circuit contact plugs 31, and the peripheral circuit lines 33. The first insulating layer 30 may be a multi-layered structure including a plurality of insulating layers. For example, the first insulating layer 30 may be formed of or include at least one of silicon oxide, silicon nitride, silicon oxynitride, and/or low-k dielectric materials.

A cell array structure CS, which includes a second substrate 100, a stack structure ST, first and second separation structures SS1 and SS2, vertical channel structures VS, and through-via structures TV, may be provided on the peripheral circuit structure PS. Hereinafter, the cell array structure CS will be described in more detail below.

The second substrate 100 may be provided on the first and second regions R1 and R2 and on the first insulating layer 30. The second substrate 100 may extend in the first and second directions D1 and D2. The second substrate 100 may be a semiconductor substrate including a semiconductor material. The second substrate 100 may be formed of or include at least one of silicon (Si), germanium (Ge), silicon germanium (SiGe), gallium arsenic (GaAs), indium gallium arsenic (InGaAs), or aluminum gallium arsenic (AlGaAs).

The stack structure ST may be provided on the second substrate 100. The stack structure ST may extend from the first region R1 toward the second region R2 or in the first direction D1. The stack structure ST may correspond to the gate stack structure 3210 of FIGS. 3 and 4.

The stack structure ST may include first blocks BLK1, which are provided on the second substrate 100 and extend in the first direction D1, and a second block BLK2, which is provided on the second substrate 100 and is interposed between a pair of the first blocks BLK1. The first blocks BLK1 may include groups of vertical channel structures VS as described herein in plan view. The second blocks BLK2 may be free of the vertical channel structures VS. FIG. 5A illustrates an example including four first blocks BLK1 and one second block BLK2 interposed between two of them, but the inventive concept is not limited to this example. For example, the structure shown in FIG. 5A may be repeated in the stack structure ST.

The first blocks BLK1 may be arranged in the second direction D2 and may be spaced apart from each other in the second direction D2 with the first separation structure SS1 or the second block BLK2 interposed therebetween. The vertical channel structures VS to be described below may be provided in each of the first blocks BLK1, and the through-via structures TV to be described below may be provided in the second block BLK2. The second block BLK2 may be spaced apart from the vertical channel structures VS in the second direction D2 by the first separation structure SS1 interposed therebetween, and each of the first blocks BLK1 adjacent to the second block BLK2 may be spaced apart from the through-via structures TV in the second direction D2 by the first separation structure SS1 interposed therebetween.

A first width W1 of each of the first blocks BLK1 in the second direction D2 may be substantially equal to a second width W2 of the second block BLK2 in the second direction D2. For example, each of the first and second widths W1 and W2 may range from about 2000 nm to 3000 nm. More specifically, each of the first and second widths W1 and W2 may range from about 2500 nm to 2800 nm.

When viewed in a plan view, the first separation structures SS1 may be provided in first trenches TR1, which are formed between the first blocks BLK1 and between the first and second blocks BLK1 and BLK2 and extend in the first direction D1. The first separation structures SS1 may extend from the first region R1 to the second region R2. In the stack structure ST, a pitch P of the first separation structures SS1 may be substantially uniform.

Referring to FIG. 6, the second separation structures SS2 may be provided in second trenches TR2, which are formed to cross an inner portion of each of the first blocks BLK1 in the first direction D1. For example, each of the second separation structures SS2 may be overlapped with some of the vertical channel structures VS in the third direction D3 (e.g., in a vertical direction).

The second separation structures SS2 may be provided within the first region R1 and may extend in the first direction D1. For example, the second separation structures SS2 may not be provided in the second region R2. In other words, a length of each of the second separation structures SS2 in the first direction D1 may be smaller than a length of each of the first separation structures SS1 in the first direction D1. A width of each of the second separation structures SS2 in the second direction D2 may be smaller than a width of each of the first separation structures SS1 in the second direction D2. The second separation structures SS2 may be spaced apart from the second block BLK2 in the second direction D2. The second block BLK2 may be free of the second separation structures SS2.

Each of the first and second separation structures SS1 and SS2 may be composed of a single insulating layer or may include a plurality of insulating layers. The first and second separation structures SS1 and SS2 may be formed of or include at least one of silicon oxide, silicon nitride, silicon oxynitride, and/or low-k dielectric materials.

When viewed in the sectional view of FIG. 7A, the stack structure ST or each of the first and second blocks BLK1 and BLK2 may include interlayer dielectric layers ILDa and ILDb and gate electrodes ELa and ELb, which are alternately and repeatedly stacked. The gate electrodes ELa and ELb may correspond to the word lines WL, the first lines LL1 and LL2, and the second lines UL1 and UL2 of FIG. 1.

More specifically, the stack structure ST may include the first stack structure STa on the second substrate 100 and the second stack structure STb on the first stack structure STa. The first stack structure STa may include first interlayer dielectric layers ILDa and first gate electrodes ELa, which are alternately and repeatedly stacked, and the second stack structure STb may include second interlayer dielectric layers ILDb and second gate electrodes ELb, which are alternately and repeatedly stacked.

As a height from the second substrate 100 (i.e., in the third direction D3) increases, a length of each of the first and second gate electrodes ELa and ELb in the first direction D1 may decrease. That is, a length of each of the first and second gate electrodes ELa and ELb in the first direction D1 may be larger than a length of another electrode thereon in the first direction D1. The lowermost one of the first gate electrodes ELa of the first stack structure STa may have the largest length in the first direction D1, and the uppermost one of the second gate electrodes ELb of the second stack structure STb may have the smallest length in the first direction D1.

Referring to FIGS. 6 and 7A, the first and second gate electrodes ELa and ELb may have the pad portions ELp on the second region R2. The pad portions ELp of the first and second gate electrodes ELa and ELb may be disposed at positions that are different from each other in horizontal and vertical directions. The pad portions ELp may form the staircase structure in the first direction D1.

Due to the staircase structure, each of the first and second stack structures STa and STb may have a decreasing thickness as a distance from the vertical channel structures VS increases, and the side surfaces of the first and second gate electrodes ELa and ELb may be spaced apart from each other by a substantially constant distance in the first direction D1, when viewed in a plan view.

The first and second gate electrodes ELa and ELb may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth).

The first and second interlayer dielectric layers ILDa and ILDb may be provided between the first and second gate electrodes ELa and ELb. Similar to the first and second gate electrodes ELa and ELb, as a height from the second substrate 100 increase, lengths of the first and second interlayer dielectric layers ILDa and ILDb in the first direction D1 may decrease.

The lowermost one of the second interlayer dielectric layers ILDb may be in contact with the uppermost one of the first interlayer dielectric layers ILDa. In an embodiment, a thickness of each of the first and second interlayer dielectric layers ILDa and ILDb may be smaller than a thickness of each of the first and second gate electrodes ELa and ELb. In the present specification, a thickness of an element may mean a length of the element measured in the third direction D3. A thickness of the lowermost one of the first interlayer dielectric layers ILDa may be smaller than those of the remaining ones of the interlayer dielectric layers ILDa and ILDb. A thickness of the uppermost one of the second interlayer dielectric layers ILDb may be larger than those of the remaining ones of the interlayer dielectric layers ILDa and ILDb. However, the inventive concept is not limited to this example, and the thicknesses of the first and second interlayer dielectric layers ILDa and ILDb may be variously changed, depending on technical properties required for each semiconductor device.

The first and second interlayer dielectric layers ILDa and ILDb may be formed of or include at least one of silicon oxide, silicon nitride, silicon oxynitride, and/or low-k dielectric materials. For example, the first and second interlayer dielectric layers ILDa and ILDb may be formed of or include at least one of high density plasma (HDP) oxide or tetraethyl orthosilicate (TEOS).

A source structure SC may be provided between the second substrate 100 and the stack structure ST. The second substrate 100 and the source structure SC may correspond to the common source line CSL of FIG. 1 and the common source line 3205 of FIGS. 3 and 4.

The source structure SC may extend parallel to the first and second gate electrodes ELa and ELb of the stack structure ST or in the first and second directions D1 and D2. The source structure SC may include a first source conductive pattern SCP1 and a second source conductive pattern SCP2, which are sequentially stacked. The second source conductive pattern SCP2 may be provided between the first source conductive pattern SCP1 and the lowermost one of the first interlayer dielectric layers ILDa. Each of the first and second source conductive patterns SCP1 and SCP2 may be formed of or include a doped semiconductor material. For example, an impurity concentration of the first source conductive pattern SCP1 may be higher than an impurity concentration of the second source conductive pattern SCP2.

A plurality of the vertical channel structures VS may be provided on the first region R1 to penetrate the first blocks BLK1 of the stack structure ST and the source structure SC and to be in contact with the second substrate 100. The vertical channel structures VS may be provided to penetrate at least a portion of the second substrate 100, and a bottom surface of each of the vertical channel structures VS may be located at a level lower than a top surface of the second substrate 100 and a bottom surface of the source structure SC. As used herein, a "level" of an element or layer may be relative to a substrate, e.g., with respect to the vertical direction D3.

The vertical channel structures VS may be arranged to form a zigzag shape in the first or second direction D1 or D2, when viewed in a plan view. The vertical channel structures VS may not be provided on the second region R2 and in the second block BLK2. The vertical channel structures VS may correspond to the vertical channel structures 3220 of FIGS. 2 to 4. The vertical channel structures VS may correspond to the channel regions of the first transistors LT1 and LT2, the memory cell transistors MCT, and the second transistors UT1 and UT2 of FIG. 1.

The vertical channel structures VS may be provided in vertical channel holes CH, which are formed to penetrate the stack structure ST. Each of the vertical channel structures VS may include a first vertical channel structure VSa, which is provided in each of first vertical channel holes CHa penetrating the first stack structure STa, and a second vertical channel structure VSb, which is provided in each of second vertical channel holes CHb penetrating the second stack structure STb. The first vertical channel structure VSa may be connected to the second vertical channel structure VSb in the third direction D3.

In an embodiment, as a height in the third direction D3 increases, a width of each of the first and second vertical channel structures VSa and VSb may increase. For example, the uppermost width of the first vertical channel structure VSa may be larger than the lowermost width of the second vertical channel structure VSb. In other words, a side surface of each of the vertical channel structures VS may have a stepwise shape near a boundary between the first and second vertical channel structures VSa and VSb. However, the inventive concept is not limited to this example, and the side surface of each of the vertical channel structures VS may have three or more stepwise portions located at different levels or may be a flat shape without a stepwise portion, unlike that illustrated in the drawings.

Each of the vertical channel structures VS may include a data storage pattern DSP, which is adjacent to the stack structure ST or covers an inner side surface of each of the vertical channel holes CH, a vertical semiconductor pattern VSP, which is provided to conformally cover an inner side surface of the data storage pattern DSP, a gapfill insulating pattern VI, which is provided to fill an internal space delimited by the vertical semiconductor pattern VSP, and a conductive pad PAD which is provided in a space delimited by the gapfill insulating pattern VI and the data storage pattern DSP. In an embodiment, a top surface of each of the vertical channel structures VS may have a circular, elliptical, or bar shape.

The vertical semiconductor pattern VSP may be provided between the data storage pattern DSP and the gapfill insulating pattern VI. The vertical semiconductor pattern VSP may be shaped like a bottom-closed pipe or macaroni or hollow cylinder. In an embodiment, the vertical semiconductor pattern VSP may be in contact with a portion of the source structure SC. In an embodiment, the vertical semiconductor pattern VSP may be formed of or include poly silicon.

The data storage pattern DSP may be shaped like a bottom-opened pipe or macaroni or hollow cylinder. The data storage pattern DSP may include a plurality of insulating layers, which are sequentially stacked. In an embodiment, the gapfill insulating pattern VI may be formed of or include silicon oxide. The conductive pad PAD may be formed of or include at least one of doped semiconductor materials or conductive materials.

A plurality of dummy vertical channel structures may be provided on the second region R2 to penetrate a second insulating layer 130, which will be described below, the stack structure ST, and the source structure SC. In an embodiment, the dummy vertical channel structures may be provided to penetrate the pad portions ELp of the first and second gate electrodes ELa and ELb. The dummy vertical channel structures may be provided near cell contact plugs CCP to be described below. The dummy vertical channel structures and the vertical channel structures VS may be formed at the same time and may have substantially the same structure. In an embodiment, the dummy vertical channel structures may be further provided on a portion of the first region R1. For example, the dummy vertical channel structures may be further provided on a portion of the first region R1 where the second block BLK2 is provided. In an embodiment, the dummy vertical channel structures may not be provided on the first region R1. In an embodiment, the dummy vertical channel structures may not be provided.

A second insulating layer 130 may be provided on the second region R2 to cover the staircase structure of the stack structure ST. The second insulating layer 130 may have a substantially flat top surface. The top surface of the second insulating layer 130 may be substantially coplanar with the uppermost surface of the stack structure ST (i.e., the top surface of the uppermost one of the second interlayer dielectric layers ILDb).

A third insulating layer 150, a fourth insulating layer 170, and a fifth insulating layer 190 may be sequentially formed on the stack structure ST and the second insulating layer 130. Each of the second to fifth insulating layers 130, 150, 170, and 190 may be formed of or include at least one of insulating materials (e.g., silicon oxide, silicon nitride, silicon oxynitride, and/or low-k dielectric materials).

Referring to FIG. 5B, the fourth insulating layer 170 may include bridges BR. The bridges BR may be spaced apart from each other in the first direction D1, with a portion of the first separation structure SS1 provided in an opening OP interposed therebetween. The bridges BR may be provided between the first blocks BLK1 or between the first and second blocks BLK1 and BLK2. The bridges BR may be provided on the first separation structure SS1 and may extend in the second direction D2. Since the fourth insulating layer 170 includes the bridges BR, it may be possible to prevent or suppress a mold structure MS (e.g., see FIGS. 10 to 13) from being collapsed during a fabrication method of a three-dimensional semiconductor memory device to be described below.

Referring back to FIG. 7A, the first separation structure SS1 may be provided to penetrate the third and fourth insulating layers 150 and 170 and the stack structure ST. The first separation structure SS1 may be provided to further penetrate at least portion of the source structure SC (e.g., the second source conductive pattern SCP2). In an embodiment, a bottom surface of the first separation structure SS1 may be in contact with a top surface of the first source conductive pattern SCP1. The first separation structure SS1 may further penetrate the second insulating layer 130, on the second region R2. The first separation structure SS1 may be spaced apart from the vertical channel structures VS and the through-via structures TV in the second direction D2.

The first separation structure SS1 may include a first portion P1, which is provided in the first trench TR1, and a second portion P2, which is provided on the first portion P1 and in the opening OP. The first portion P1 of the first separation structure SS1 may be in contact with side surfaces of the second source conductive pattern SCP2, the gate electrodes ELa and ELb, and the interlayer dielectric layers ILDa and ILDb. A top surface of the first portion P1 of the first separation structure SS1 may be substantially coplanar with a top surface of the third insulating layer 150. As a height in the third direction D3 increases, a width, in the second direction D2, of the first portion P1 of the first separation structure SS1 may increase. A width of the first portion P1 of the first separation structure SS1 in the second direction D2 may be smaller than a width of the second portion P2 in the second direction D2. The top surface of the first portion P1 of the first separation structure SS1 may be located at substantially the same level as a top surface of the second separation structure SS2. A top surface of the first separation structure SS1 may be substantially coplanar with a top surface of the fourth insulating layer 170.

The second separation structure SS2 may be provided to penetrate at least a portion of the first block BLK1 of the stack structure ST. The second separation structure SS2 may be provided in the second trench TR2. In other words, the second separation structure SS2 may be provided in the first region R1. The second separation structure SS2 may be spaced apart from the second block BLK2 and the first separation structures SS1 in the second direction D2. The top surface of the second separation structure SS2 may be located at a level lower than the top surface of the first separation structure SS1. The top surface of the second separation structure SS2 may be located at a level higher than the top surface of each of the vertical channel structures VS. In an embodiment, the top surface of the second separation structure SS2 may be substantially coplanar with the top surface of the third insulating layer 150.

Cell contact plugs CCP may be provided on the second region R2 to penetrate the second to fourth insulating layers 130, 150, and 170. Each of the cell contact plugs CCP may further penetrate one of the interlayer dielectric layers ILDa and ILDb of the stack structure ST and may be in contact with and electrically connected to one of the gate electrodes ELa and ELb. The cell contact plugs CCP may be provided on the pad portions ELp. The cell contact plugs CCP may be spaced apart from the dummy vertical channel structures. As a distance from the vertical channel structures VS increases, a height of each of the cell contact plugs CCP in the third direction D3 may increase. The cell contact plugs CCP may correspond to the gate connection lines 3235 of FIG. 4.

The through-via structures TV may be provided on the first region R1 to penetrate the third and fourth insulating layers 150 and 170, the second block BLK2 of the stack structure ST, the source structure SC, and the second substrate 100, and here, each of the through-via structures TV may be electrically connected to one of the peripheral circuit transistors PTR of the peripheral circuit structure PS, respectively. Each of the through-via structures TV may be provided to further penetrate at least a portion of the first insulating layer 30 and may be in contact with one of the peripheral circuit lines 33 of the peripheral circuit structure PS. The through-via structures TV may be spaced apart from the first separation structures SS1, which are interposed between the first and second blocks BLK1 and BLK2, in the second direction D2.

A top surface of each of the through-via structures TV may be located at a level higher than a top surface of each of the vertical channel structures VS. A bottom surface of each of the through-via structures TV may be located at a level lower than a bottom surface of each of the first separation structures SS1 and a bottom surface of each of the vertical channel structures VS. A height of each of the through-via structures TV in the third direction D3 may be larger than a height of each of the cell contact plugs CCP in the third direction D3 and a height of each of the vertical channel structures VS in the third direction D3. In an embodiment, the through-via structures TV may correspond to the penetration line 3245 described with reference to FIGS. 3 and 4.

In an embodiment, as a height in the third direction D3 increases, a width of each of the cell contact plugs CCP and the through-via structures TV may increase. The cell contact plugs CCP and the through-via structures TV may be formed of or include at least one of conductive (e.g., metallic) materials.

A through-via spacer TVS may be provided to enclose each of the through-via structures TV. The through-via spacer TVS may be provided to conformally cover a side surface of each of the through-via structures TV. Each of the through-via structures TV may be spaced apart from and electrically disconnected from the gate electrodes ELa and ELb by the through-via spacer TVS interposed therebetween. The through-via spacer TVS may be formed of or include at least one of silicon oxide, silicon nitride, silicon oxynitride, and/or low-k dielectric materials.

In an embodiment, referring to FIG. 7B, the through-via spacer TVS may be locally provided on only the side surfaces of the gate electrodes ELa and ELb, the side surface of the source structure SC, and the side surface of the second substrate 100. Here, the interlayer dielectric layers ILDa and ILDb may be in direct contact with the through-via structures TV, and the gate electrodes ELa and ELb may be spaced apart from each of the through-via structures TV with the through-via spacer TVS interposed therebetween. When elements or layers are described herein as being in "direct contact" or "directly on" one another, no intervening elements or layers are present.

The bit lines BL and the conductive lines CL may be provided on the fifth insulating layer 190, and here, the bit lines BL may be electrically connected to the vertical channel structures VS and the through-via structures TV, and the conductive lines CL may be electrically connected to the cell contact plugs CCP. Referring to FIG. 6, each of the vertical channel structures VS may be overlapped with a pair of the bit lines BL in the third direction D3 and may be electrically connected to one of them. The bit lines BL and the conductive lines CL may be formed of or include at least one of conductive materials (e.g., metallic materials). The bit lines BL may correspond to the bit line BL of FIG. 1 and the bit lines 3240 of FIGS. 3 and 4. The conductive lines CL may correspond to the conductive lines 3250 of FIG. 4.

An additional insulating layer and additional interconnection lines may be provided on the fifth insulating layer 190 to cover the bit lines BL and the conductive lines CL, and here, the additional interconnection lines may be provided in the additional insulating layer.

According to an embodiment of the inventive concept, the second width W2 of the second block BLK2 may be equal to the first width W1 of each of the first blocks BLK1, and in this case, it may be possible to reduce a variation in the width of each of the first trenches TR1 and the pitch P of the first separation structures SS1. Accordingly, it may be possible to prevent or suppress an upper width of the first trenches TR1, which are adjacent to the second block BLK2, from being increased, to prevent or suppress a lower portion of the mold structure MS (e.g., see FIGS. 10 to 13) from bursting, and thereby to use the vertical channel structures VS in the first blocks BLK1 adjacent to the second block BLK2 as memory cell transistors. In other words, by reducing or eliminating a dummy region of the stack structure ST, it may be possible to improve electrical characteristics and reliability of a three-dimensional semiconductor memory device and to reduce a size of a semiconductor chip.

Figure 8:
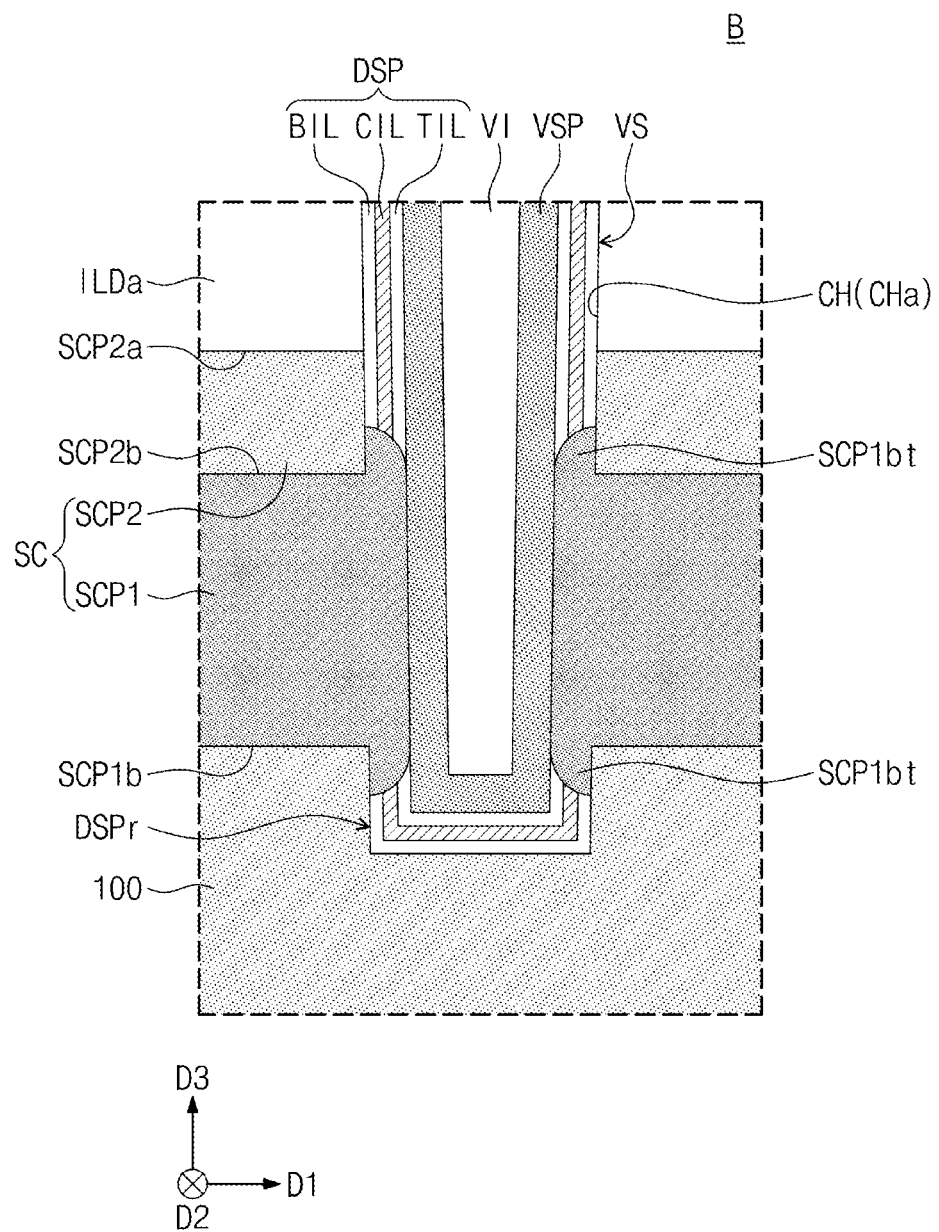
FIG. 8 is an enlarged sectional view illustrating a portion (e.g., B of FIG. 7A or 7B) of a three-dimensional semiconductor memory device according to an embodiment of the inventive concept.

FIG. 8 is an enlarged sectional view illustrating a portion (e.g., B of FIG. 7A or 7B) of a three-dimensional semiconductor memory device according to an embodiment of the inventive concept.

The sectional view of FIG. 8 illustrates a portion of one of the vertical channel structures VS, a portion of the source structure SC, and a portion of the second substrate 100, and in an embodiment, each of the vertical channel structures VS may include the data storage pattern DSP, the vertical semiconductor pattern VSP, the gapfill insulating pattern VI, and a lower data storage pattern DSPr.

The data storage pattern DSP may include a blocking insulating layer BIL, a charge storing layer CIL, and a tunneling insulating layer TIL, which are sequentially stacked. The blocking insulating layer BIL may be provided to cover an inner side surface of each of the vertical channel holes CH. The tunneling insulating layer TIL may be provided adjacent to the vertical semiconductor pattern VSP. The charge storing layer CIL may be interposed between the blocking insulating layer BIL and the tunneling insulating layer TIL.

The blocking insulating layer BIL, the charge storing layer CIL, and the tunneling insulating layer TIL may extend in the third direction D3, between the stack structure ST and the vertical semiconductor pattern VSP. In an embodiment, the Fowler-Nordheim (FN) tunneling phenomenon, which is caused by a voltage difference between the vertical semiconductor pattern VSP and the first and second gate electrodes ELa and ELb, may be used to store or change data stored in the data storage pattern DSP. In an embodiment, the blocking insulating layer BIL and the tunneling insulating layer TIL may be formed of or include silicon oxide, and the charge storing layer CIL may be formed of or include silicon nitride or silicon oxynitride.

The first source conductive pattern SCP1 of the source structure SC may be in contact with the vertical semiconductor pattern VSP, and the second source conductive pattern SCP2 may be spaced apart from the vertical semiconductor pattern VSP with the data storage pattern DSP interposed therebetween. The first source conductive pattern SCP1 may be spaced apart from the gapfill insulating pattern VI with the vertical semiconductor pattern VSP interposed therebetween.

More specifically, the first source conductive pattern SCP1 may include protruding portions SCP1bt which are located at a level higher than a bottom surface SCP2b of the second source conductive pattern SCP2 or lower than a bottom surface SCP1b of the first source conductive pattern SCP1. However, the protruding portions SCP1bt may be located at a level lower than a top surface SCP2a of the second source conductive pattern SCP2. A surface of the protruding portion SCP1bt, which is in contact with the data storage pattern DSP or the lower data storage pattern DSPr, may have a curved shape.

Figure 9:
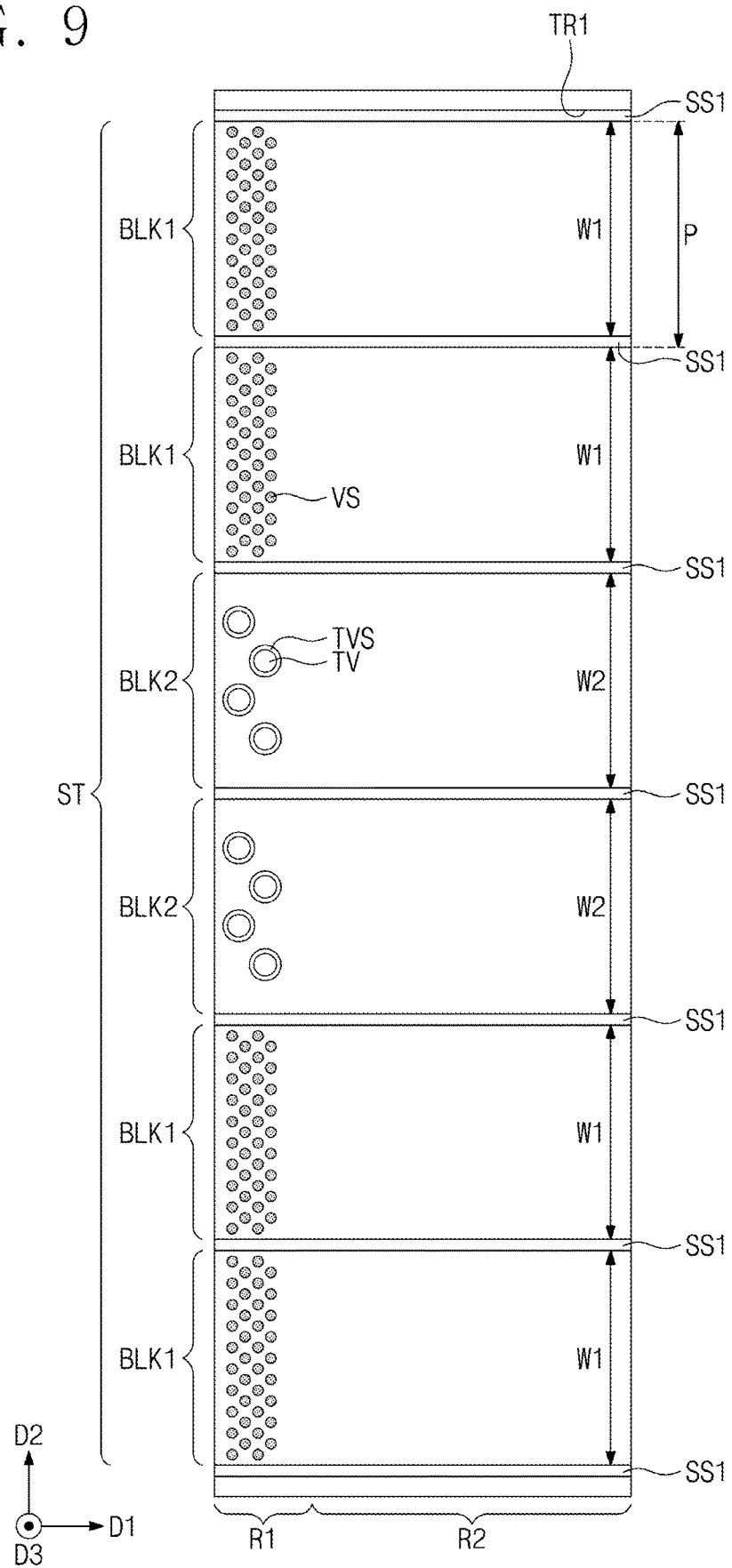
FIG. 9 is a plan view illustrating a three-dimensional semiconductor memory device according to an embodiment of the inventive concept.

FIG. 9 is a plan view illustrating a three-dimensional semiconductor memory device according to an embodiment of the inventive concept. In the following description, an element previously described with reference to the above figures may be identified by the same reference number without repeating an overlapping description thereof, for conciseness.

Referring to FIG. 9, the stack structure ST may be provided on the second substrate 100 and may include the first blocks BLK1, which extend in the first direction D1, and the second blocks BLK2, which are interposed between a pair of the first blocks BLK1. In other words, the second blocks BLK2 may be successively arranged. FIG. 9 illustrates an example including four first blocks BLK1 and two second blocks BLK2 interposed between two of the first blocks BLK1, but the inventive concept is not limited to this example. For example, the structure shown in FIG. 9 may be repeated in the stack structure ST.

When viewed in a plan view, the first separation structures SS1 may be provided in the first trenches TR1, respectively, which are formed between the first blocks BLK1, between the second blocks BLK2, and between the first and second blocks BLK1 and BLK2 and extend in the first direction D1. The second blocks BLK2 may be spaced apart from each other in the second direction D2 by one of the first separation structures SS1 interposed therebetween. The pitch P of the first separation structures SS1 in the stack structure ST may be substantially uniform. The first width W1 of each of the first blocks BLK1 in the second direction D2 may be substantially equal to the second width W2 of each of the second blocks BLK2 in the second direction D2.

FIGS. 10, 11, 12, 13, and 14 are sectional views, which are respectively taken along a line I-I' of FIG. 6 to illustrate a method of fabricating a three-dimensional semiconductor memory device according to an embodiment of the inventive concept.

Hereinafter, a method of fabricating a three-dimensional semiconductor memory device, according to an embodiment of the inventive concept, will be described in more detail with reference to FIGS. 10 to 14.

Figure 10:
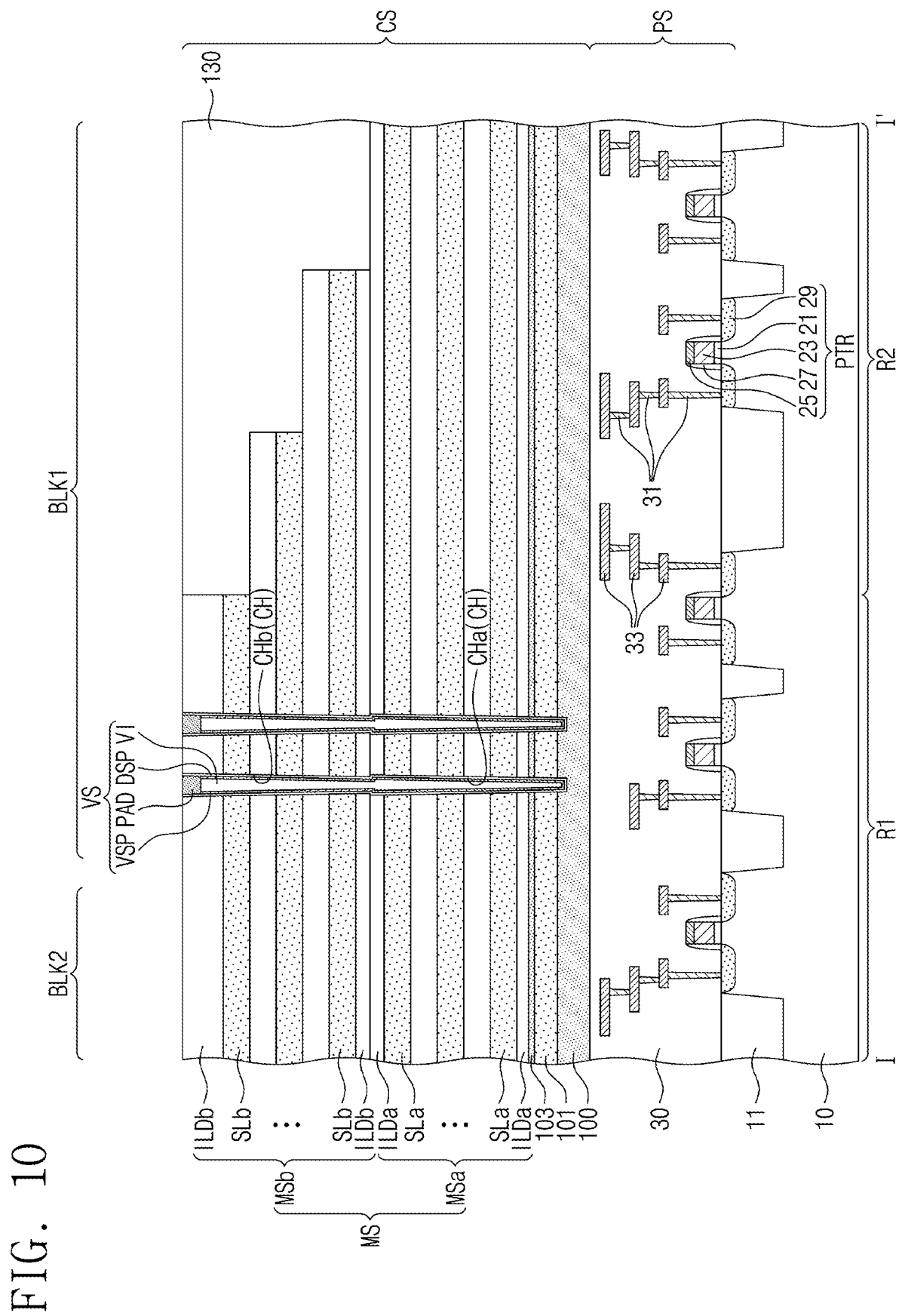
FIGS. 10, 11, 12, 13, and 14 are sectional views, which are respectively taken along a line I-I' of FIG. 6 to illustrate a method of fabricating a three-dimensional semiconductor memory device according to an embodiment of the inventive concept.

Referring to FIG. 10, the first substrate 10 including the first and second regions R1 and R2 may be provided. The device isolation layer 11 may be formed in the first substrate 10 to define an active region. The formation of the device isolation layer 11 may include forming a trench in an upper portion of the first substrate 10 and filling the trench with a silicon oxide layer.

The peripheral circuit transistors PTR may be formed on the active region defined by the device isolation layer 11. The peripheral circuit contact plugs 31 and the peripheral circuit lines 33 may be formed on the first substrate 10 and may be connected to the peripheral source/drain regions 29 of the peripheral circuit transistors PTR. The first insulating layer 30 may be formed to cover the peripheral circuit transistors PTR, the peripheral circuit contact plugs 31, and the peripheral circuit lines 33.

The second substrate 100, a lower sacrificial layer 101, and a lower semiconductor layer 103 may be sequentially formed on the first insulating layer 30. In an embodiment, the lower sacrificial layer 101 may be formed of or include silicon nitride. In another embodiment, the lower sacrificial layer 101 may be formed by sequentially stacking a plurality of insulating layers (e.g., a plurality of oxide layers and a nitride layer therebetween). The lower semiconductor layer 103 may be formed of or include the same material as the second substrate 100.

The mold structure MS may be formed on the lower semiconductor layer 103. The formation of the mold structure MS may include forming a first mold structure MSa on the lower semiconductor layer 103 and forming a second mold structure MSb on the first mold structure MSa.

The formation of the first mold structure MSa may include alternately and repeatedly stacking the first interlayer dielectric layers ILDa and first sacrificial layers SLa on the lower semiconductor layer 103 and performing a trimming process on the first interlayer dielectric layers ILDa and the first sacrificial layers SLa.

The trimming process may include forming a mask pattern to cover a top surface of the uppermost one of the first interlayer dielectric layers ILDa, patterning some of the first interlayer dielectric layers ILDa and the first sacrificial layers SLa using the mask pattern as an etching mask, reducing an area of the mask pattern, and patterning others of the first interlayer dielectric layers ILDa and the first sacrificial layers SLa using the reduced mask pattern as an etching mask. The step of reducing the area of the mask pattern and the patterning step may be alternately repeated. As a result of the trimming process, the first mold structure MSa may have a staircase structure.

The formation of the second mold structure MSb may include alternately and repeatedly stacking the second interlayer dielectric layers ILDb and second sacrificial layers SLb on the first mold structure MSa and performing the trimming process on the second interlayer dielectric layers ILDb and the second sacrificial layers SLb. As a result of the trimming process, the second mold structure MSb may have a staircase structure.

The first and second sacrificial layers SLa and SLb may be formed of or include an insulating material different from the first and second interlayer dielectric layers ILDa and ILDb. The first and second sacrificial layers SLa and SLb may be formed of or include a material having an etch selectivity with respect to the first and second interlayer dielectric layers ILDa and ILDb. For example, the first and second sacrificial layers SLa and SLb may be formed of or include silicon nitride, and the first and second interlayer dielectric layers ILDa and ILDb may be formed of or include silicon oxide. The first and second sacrificial layers SLa and SLb may be formed to have substantially the same thickness, and the first and second interlayer dielectric layers ILDa and ILDb may have at least two different thicknesses depending on their vertical positions.

After forming the first and second mold structures MSa and MSb, the second insulating layer 130 may be formed to cover the staircase structures of the first and second mold structures MSa and MSb. The top surface of the second insulating layer 130 may be substantially coplanar with a top surface of the mold structure MS (i.e., a top surface of the second mold structure MSb). In the following description, the expression of "two elements are coplanar with each other" may mean that a planarization process may be performed on the elements. The planarization process may be performed using, for example, a chemical mechanical polishing (CMP) process or an etch-back process.

The vertical channel structures VS may be formed in the vertical channel holes CH, which are formed to penetrate the mold structure MS, the lower semiconductor layer 103, and the lower sacrificial layer 101. The formation of the vertical channel structures VS may include forming the first vertical channel holes CHa to penetrate the first mold structure MSa, the lower semiconductor layer 103, and the lower sacrificial layer 101 after forming the first mold structure MSa, forming the second vertical channel holes CHb to penetrate the second mold structure MSb and to be connected to the first vertical channel holes CHa after forming the second mold structure MSb on the first mold structure MSa, and forming the data storage pattern DSP, the vertical semiconductor pattern VSP, the gapfill insulating pattern VI, and the conductive pad) PAD to fill the first and second vertical channel holes CHa and CHb.

Figure 11:
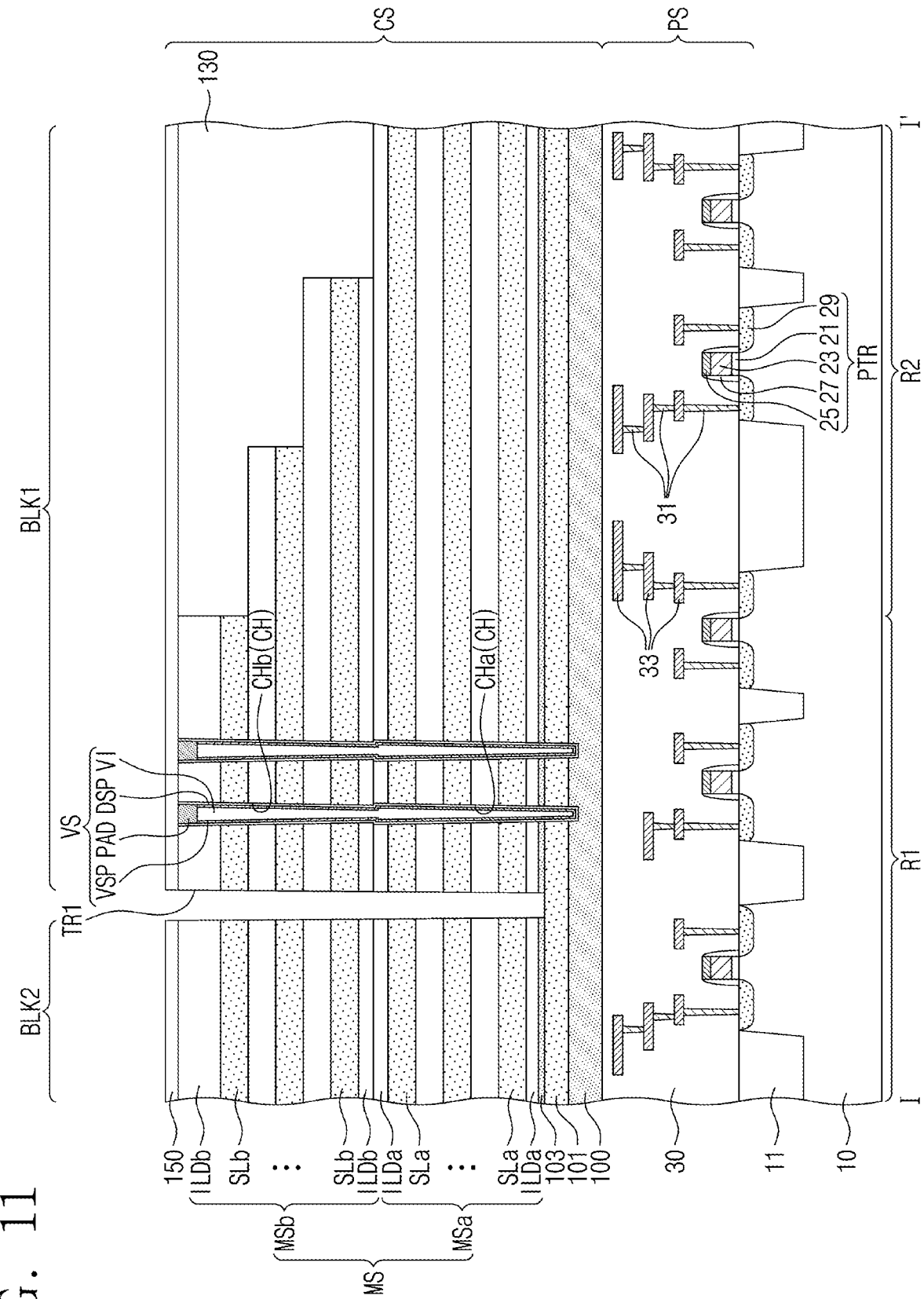

Referring to FIG. 11, after the formation of the mold structure MS and the vertical channel structures VS, the third insulating layer 150 may be formed to cover the top surface of the mold structure MS and the top surfaces of the vertical channel structures VS.

The first trenches TR1 may be formed between the first blocks BLK1 and between the first and second blocks BLK1 and BLK2 to penetrate the third insulating layer 150, the mold structure MS, and the lower semiconductor layer 103 and to extend in the first direction D1. The second trenches TR2 may be formed in each of the first blocks BLK1 to penetrate a portion of the mold structure MS and the third insulating layer 150 and to extend in the first direction D1. A portion of the lower sacrificial layer 101 may be exposed to the outside by each of the first trenches TR1.

Figure 12:
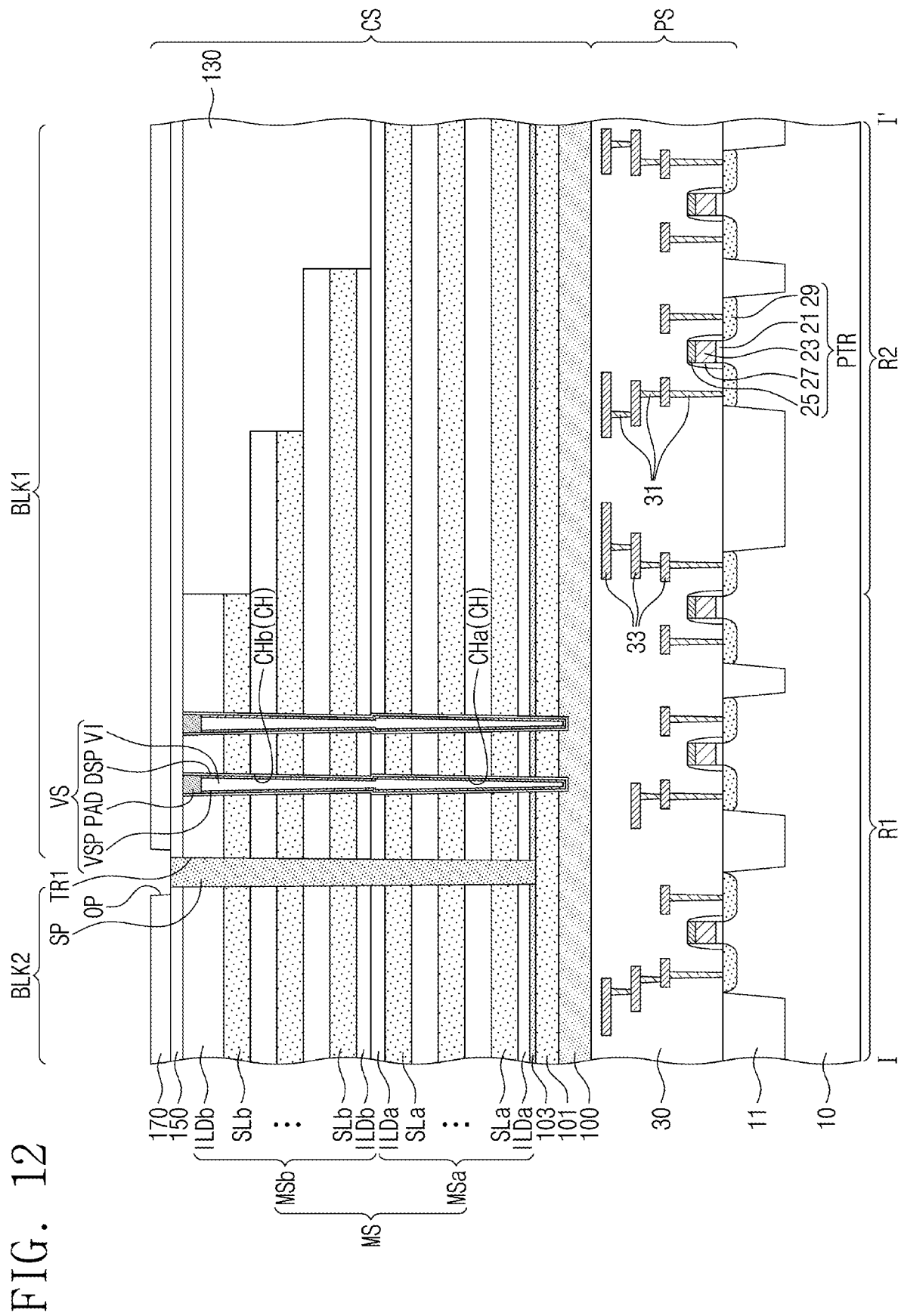

Referring to FIG. 12, a sacrificial poly-silicon layer SP may be formed to fill an inner space of each of the first trenches TR1. A top surface of the sacrificial poly-silicon layer SP may be substantially coplanar with the top surface of the third insulating layer 150. Here, an inner space of each of the second trenches TR2 may be filled with silicon oxide. The silicon oxide filling the inner space of each of the second trenches TR2 may be referred to as the second separation structure SS2.

The fourth insulating layer 170 may be formed to cover the top surface of the third insulating layer 150. Thereafter, the openings OP may be formed on portions of each of the first trenches TR1 by patterning the fourth insulating layer 170. The openings OP may be connected to the first trenches TR1, respectively. The openings OP may not be formed on the second trenches TR2.

Figure 13:
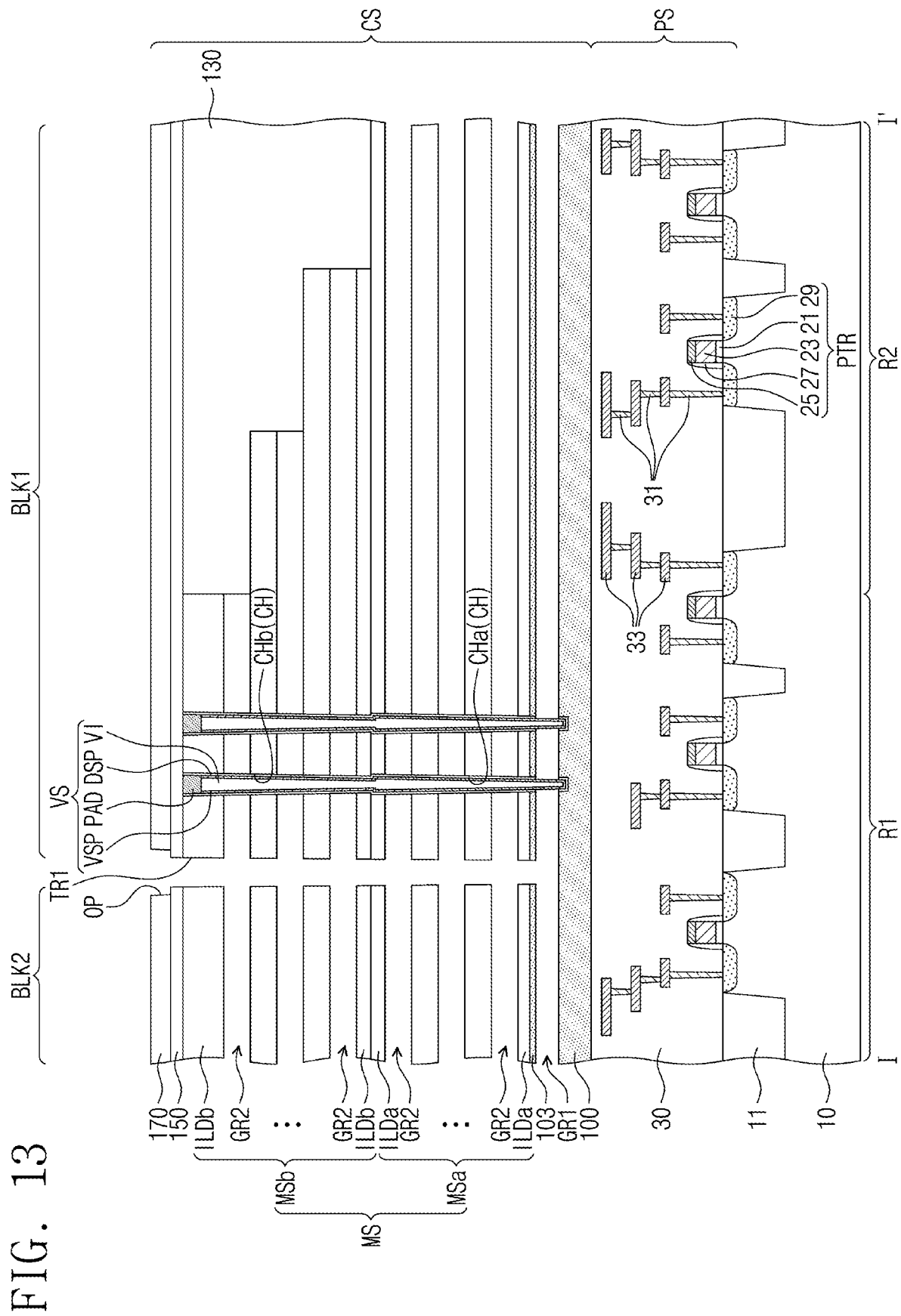

Referring to FIG. 13, the sacrificial poly-silicon layer SP exposed by the openings OP may be removed. Thereafter, the sacrificial layers 101, SLa, and SLb exposed by the first trenches TR1 may be selectively removed. The selective removal of the sacrificial layers 101, SLa, and SLb may be performed by a wet etching process using etching solution. The first and second interlayer dielectric layers ILDa and ILDb may not be removed by the selective removal process of the sacrificial layers 101, SLa, and SLb.

A space, which is formed by removing the lower sacrificial layer 101 during the selective removal process, may be defined as a first gap region GR1, and spaces, which are formed by removing the first and second sacrificial layers SLa and SLb during the selective removal process, may be defined as second gap regions GR2. The first and second gap regions GR1 and GR2 may be formed to partially expose the side surfaces of the vertical channel structures VS. Here, the first gap region GR1 may be formed to expose a portion of the side surface of the vertical semiconductor pattern VSP of each of the vertical channel structures VS.

Figure 14:
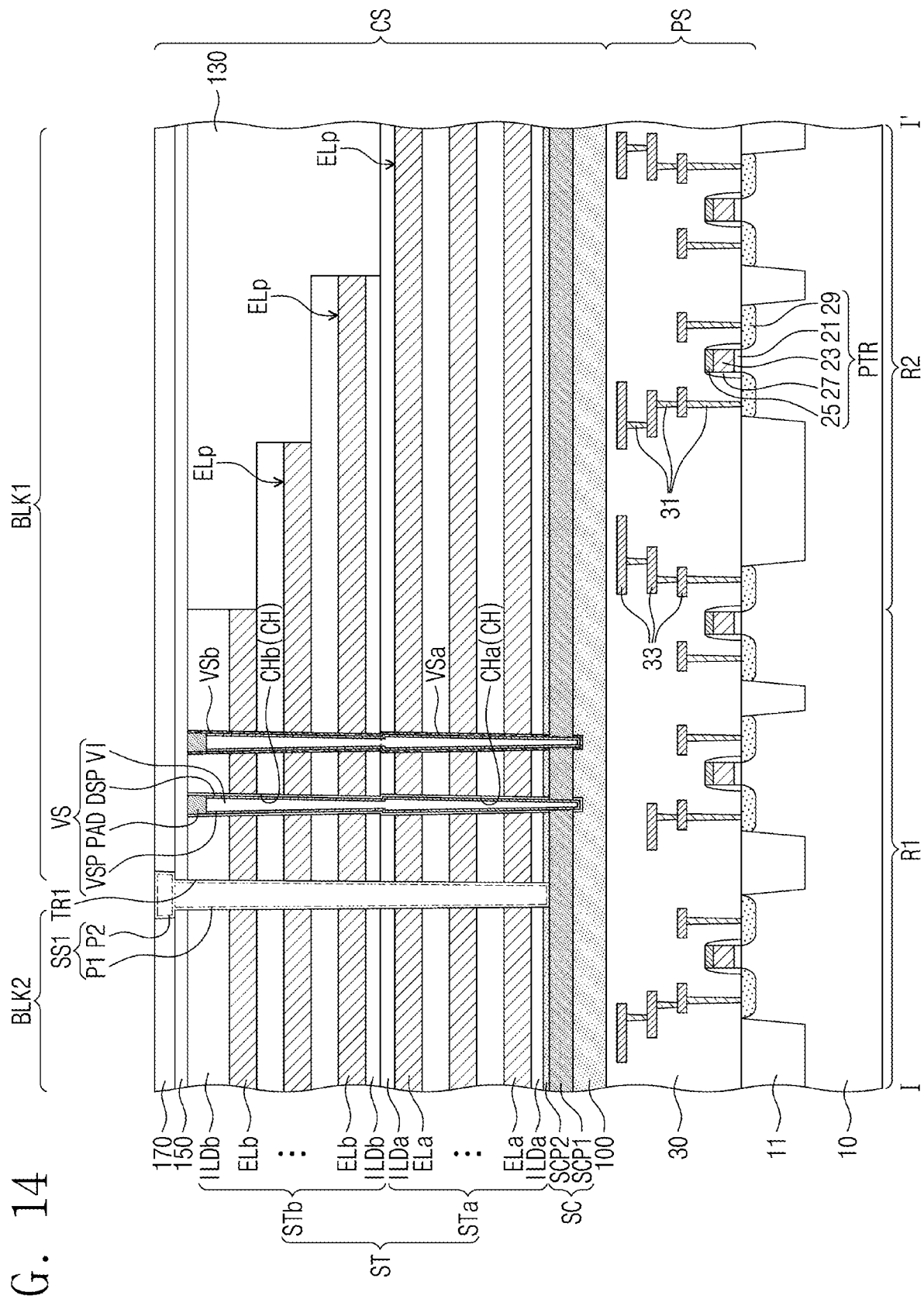

Referring to FIG. 14, the first source conductive pattern SCP1 may be formed to fill the first gap region GR1. The lower semiconductor layer 103 on the first source conductive pattern SCP1 may be referred to as the second source conductive pattern SCP2. As a result, the source structure SC including the first and second source conductive patterns SCP1 and SCP2 may be formed.

The first and second gate electrodes ELa and ELb may be formed to fill the second gap regions GR2, and as a result, the stack structure ST including the first and second gate electrodes ELa and ELb and the first and second interlayer dielectric layers ILDa and ILDb may be formed.

Thereafter, the first separation structures SS1 may be formed to fill the openings OP and the first trenches TR1. A top surface of each of the first separation structures SS1 may be substantially coplanar with the top surface of the fourth insulating layer 170. The first separation structures SS1 may be interposed between the first blocks BLK1 and between the first and second blocks BLK1 and BLK2.

Referring back to FIGS. 5A, 5B, 6, and 7A, the through-via structures TV may be formed on the first region R1 to penetrate the second block BLK2 of the stack structure ST. Each of the through-via structures TV may be formed to further penetrate the source structure SC, the second substrate 100, and at least a portion of the first insulating layer 30 and may be electrically connected to one of the peripheral circuit transistors PTR of the peripheral circuit structure PS.

The cell contact plugs CCP may be formed on the second region R2 to penetrate the second to fourth insulating layers 130, 150, and 170 and one of the first and second interlayer dielectric layers ILDa and ILDb. Each of the cell contact plugs CCP may be electrically connected to a corresponding one of the first and second gate electrodes ELa and ELb.

The fifth insulating layer 190 may be formed on the fourth insulating layer 170 to cover the through-via structures TV, the cell contact plugs CCP, and the first separation structures SS1. The bit lines BL and the conductive lines CL may be formed on the fifth insulating layer 190. Here, the bit lines BL may be electrically connected to the vertical channel structures VS and the through-via structures TV, and the conductive lines CL may be electrically connected to the cell contact plugs CCP.

According to an embodiment of the inventive concept, since each of the first and second blocks BLK1 and BLK2 has the same width in the second direction D2 and the pitch P of the first separation structures SS1 is uniform, a patterning process for forming the first trenches TR1 may be performed in an easy and simple manner, and thus, the fabrication process may be simplified.

Figure 15:
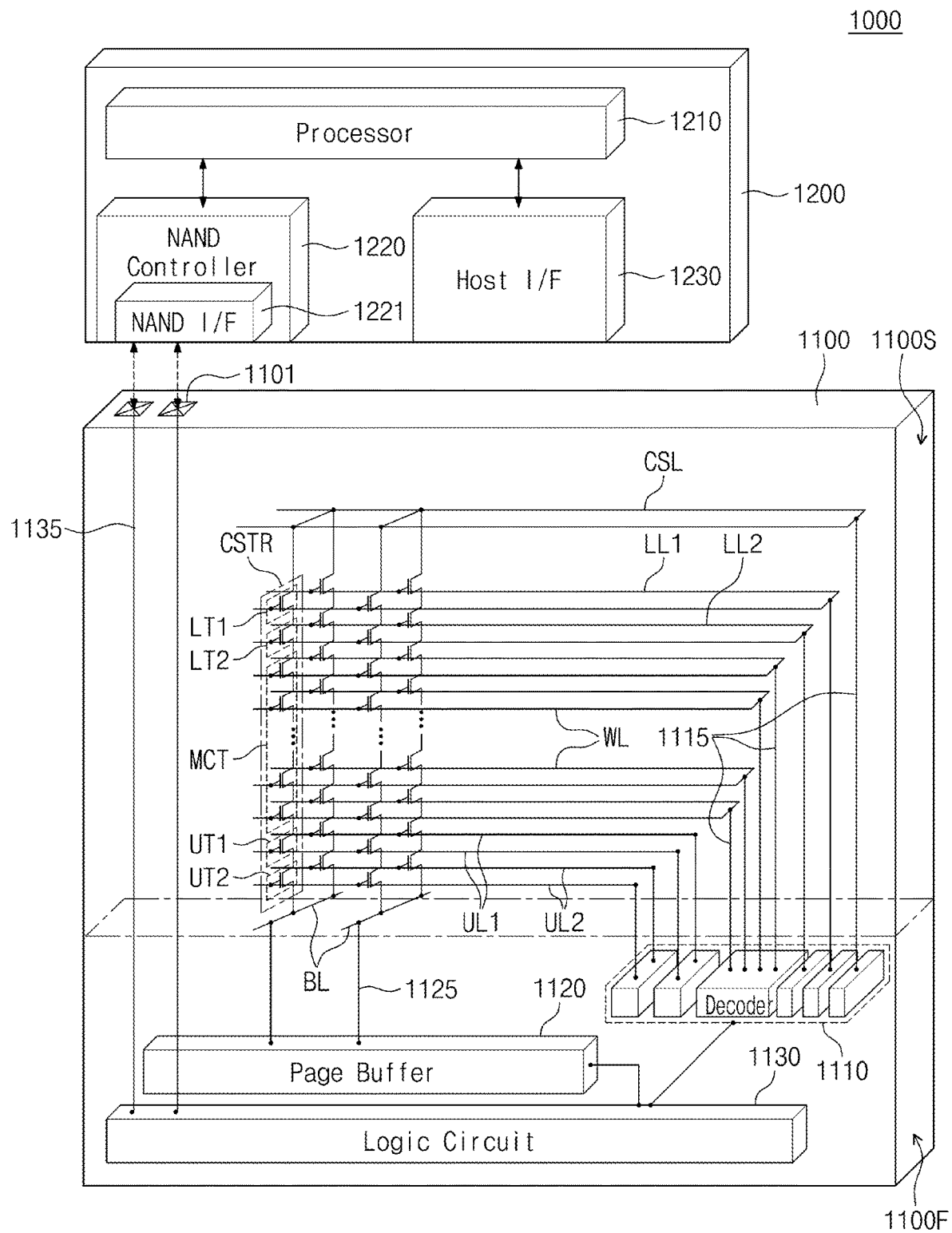
FIG. 15 is a schematic diagram illustrating an electronic system including a three-dimensional semiconductor memory device according to an embodiment of the inventive concept.

FIG. 15 is a schematic diagram illustrating an electronic system including a three-dimensional semiconductor memory device according to an embodiment of the inventive concept. In the following description, an element previously described with reference to FIG. 1 may be identified by the same reference number without repeating an overlapping description thereof, for conciseness.

Referring to FIG. 15, the memory cell strings CSTR, which include the first transistors LT1 and LT2, the second transistors UT1 and UT2, and the memory cell transistors MCT disposed between the first transistors LT1 and LT2 and the second transistors UT1 and UT2, and the word lines WL, which are connected to the memory cell strings CSTR, may be provided in the second region 1100S, and here, the memory cell strings CSTR and the word lines WL may be provided between the bit line BL, which is adjacent to the first region 1100F, and the common source line CSL. The common source line CSL may be provided in an upper portion of the second region 1100S, and the bit line BL may be provided in a lower portion of the second region 1100S.

Figure 16:
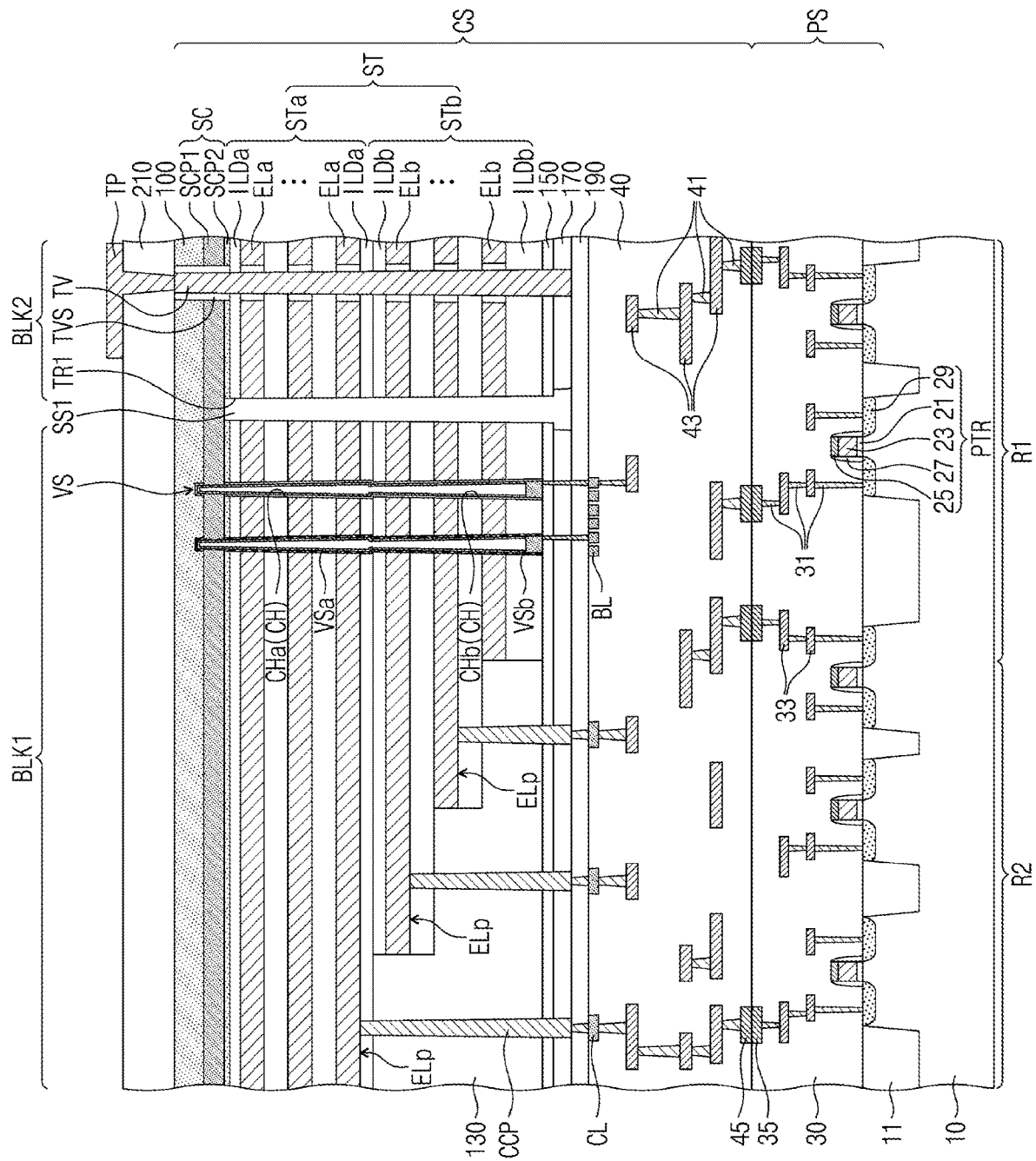
FIG. 16 is a sectional view illustrating a semiconductor package including a three-dimensional semiconductor memory device according to an embodiment of the inventive concept.

FIG. 16 is a sectional view illustrating a semiconductor package including a three-dimensional semiconductor memory device according to an embodiment of the inventive concept. In the following description, an element previously described with reference to FIGS. 7A and 7B may be identified by the same reference number without repeating an overlapping description thereof, for conciseness.

Referring to FIG. 16, the peripheral circuit structure PS, which includes the peripheral transistors PTR, the peripheral contact plugs 31, the peripheral circuit lines 33 electrically connected to the peripheral transistors PTR through the peripheral contact plugs 31, first bonding pads 35 electrically connected to the peripheral circuit lines 33, and the first insulating layer 30 enclosing them, may be provided on the first substrate 10. The first insulating layer 30 may not cover top surfaces of the first bonding pads 35. The first insulating layer 30 may have a top surface that is substantially coplanar with the top surfaces of the first bonding pads 35.

The cell array structure CS including second bonding pads 45, the bit lines BL, and the stack structure ST may be provided on the peripheral circuit structure PS.

The second bonding pads 45 in contact with the first bonding pads 35 of the peripheral circuit structure PS, connection contact plugs 41, connection circuit lines 43 electrically connected to the second bonding pads 45 through the connection contact plugs 41, and a sixth insulating layer 40 enclosing them may be provided on the first insulating layer 30.

The sixth insulating layer 40 may have a multi-layered structure including a plurality of insulating layers. For example, the sixth insulating layer 40 may be formed of or include at least one of silicon oxide, silicon nitride, silicon oxynitride, and/or low-k dielectric materials. As a distance in the third direction D3 increases, the connection contact plugs 41 may have a decreasing width. The connection contact plugs 41 and the connection circuit lines 43 may be formed of or include at least one of conductive (e.g., metallic) materials.

A bottom surface of each of the second bonding pads 45 may be in direct contact with a top surface of each of the first bonding pads 35. The first and second bonding pads 35 and 45 may be formed of or include at least one of, for example, copper (Cu), tungsten (W), aluminum (Al), nickel (Ni), or tin (Sn). As an example, the first and second bonding pads 35 and 45 may be formed of or include copper (Cu). The first and second bonding pads 35 and 45 may be connected to each other without any interface therebetween and may form a single or unitary object. The side surfaces of the first and second bonding pads 35 and 45 are illustrated to be aligned to each other, but the inventive concept is not limited to this example. For example, the side surfaces of the first and second bonding pads 35 and 45 may be spaced apart from each other, when viewed in a plan view.

The bit lines BL and the conductive lines CL may be provided in an upper portion of the sixth insulating layer 40 to be in contact with the connection contact plugs 41. The stack structure ST, the vertical channel structures VS electrically connected to the bit lines BL, and the cell contact plugs CCP electrically connected to the conductive lines CL may be provided on the sixth insulating layer 40. As a height in the third direction D3 increases, each of the vertical channel structures VS and the cell contact plugs CCP may have a decreasing width.

As a distance from the outermost one of the vertical channel structures VS increases, each of the first and second stack structures STa and STb on the second region R2 may have a decreasing thickness in the third direction D3. More specifically, as a distance from the first substrate 10 increases, lengths, in the first direction D1, of the first gate electrodes ELa of the first stack structure STa and the second gate electrodes ELb of the second stack structure STb may increase. The side surfaces of the first and second gate electrodes ELa and ELb may be spaced apart from each other in the first direction D1 by a specific distance, when viewed in a plan view. The lowermost one of the second gate electrodes ELb of the second stack structure STb may have the smallest length in the first direction D1, and the uppermost one of the first gate electrodes ELa of the first stack structure STa may have the largest length in the first direction D1.

The source structure SC and the second substrate 100 may be provided on the stack structure ST. In other words, the stack structure ST may be provided between the second substrate 100 and the peripheral circuit structure PS. A seventh insulating layer 210 may be provided on the second substrate 100. An upper pad TP may be provided on the seventh insulating layer 210 and may be connected to one of the through-via structures TV.

Since the cell array structure CS is coupled to the peripheral circuit structure PS, the three-dimensional semiconductor memory device may have an increased cell capacity per unit area. In addition, the peripheral circuit structure PS and the cell array structure CS may be separately fabricated and then may be coupled to each other, and in this case, it may be possible to prevent the peripheral transistors PTR from being damaged by several thermal treatment processes. Accordingly, the electrical characteristics and reliability of the three-dimensional semiconductor memory device may be improved.

According to an embodiment of the inventive concept, each of blocks (e.g., first and second blocks) of a stack structure may be provided to have the same width, and in this case, it may be possible to reduce a variation in a width of each of first trenches and in a pitch of first separation structures. Accordingly, it may be possible to prevent or suppress an upper width of the first trenches, which are adjacent to the second block, from being increased, to prevent or suppress a lower portion of a mold structure from bursting, and thereby to use vertical channel structures, which are provided in the first blocks adjacent to the second block, as memory cell transistors. In other words, by reducing or eliminating a dummy region of the stack structure, it may be possible to improve electrical characteristics and reliability of a three-dimensional semiconductor memory device and to reduce a size of a semiconductor chip.

According to an embodiment of the inventive concept, since the first and second blocks has the same width and the first separation structures have the uniform pitch, a patterning process for forming the first trenches may be performed in an easy and simple manner, and thus, a fabrication process may be simplified.

While example embodiments of the inventive concept have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a substrate;
   a stack structure on the substrate, the stack structure comprising first blocks that extend in a first direction and are arranged in a second direction intersecting the first direction, and a second block that is between the first blocks;
   separation structures that extend in the first direction and are arranged in the second direction between the first blocks and between the first and second blocks;
   vertical channel structures that penetrate the first blocks and contact the substrate; and
   through-via structures that penetrate the second block and the substrate,
   wherein a first width of each of the first blocks in the second direction is equal to a second width of the second block in the second direction.

2. The device of claim 1, wherein the second block is free of the vertical channel structures and is spaced apart from the vertical channel structures in the second direction with one of the separation structures therebetween.

3. The device of claim 1, wherein each of the first blocks is spaced apart from the through-via structures in the second direction with one of the separation structures therebetween.

4. The device of claim 1, further comprising bit lines that are on the stack structure, extend in the second direction, and are electrically connected to the vertical channel structures of the first blocks and the through-via structures of the second block.

5. The device of claim 1, wherein the first and second blocks respectively comprise interlayer dielectric layers and gate electrodes, which are alternately stacked.

6. The device of claim 5, further comprising through-via spacers that extend around the through-via structures,
   wherein the through-via structures are spaced apart from the gate electrodes with the through-via spacers therebetween.

7. The device of claim 1, wherein the second block comprises a plurality of second blocks, which are between the first blocks.

8. The device of claim 7, wherein the plurality of second blocks are spaced apart from each other in the second direction with one of the separation structures therebetween.

9. The device of claim 7, wherein the plurality of second blocks have a same width in the second direction.

10. The device of claim 1, wherein each of the separation structures comprises a first portion and a second portion on the first portion, and a width of the first portion in the second direction is less than a width of the second portion in the second direction.

11. The device of claim 1, wherein each of the first and second widths in the second direction is about 2500 nm to 2800 nm.

12. A three-dimensional semiconductor memory device, comprising:
a first substrate;
a peripheral circuit structure comprising peripheral circuit transistors on the first substrate;
a second substrate on the peripheral circuit structure;
a stack structure on the second substrate, the stack structure comprising first blocks that extend in a first direction and are arranged in a second direction intersecting the first direction, and a second block that is between the first blocks;
first separation structures that extend in the first direction and are arranged in the second direction between the first blocks and between the first and second blocks;
second separation structures that intersect respective inner portions of the first blocks in the first direction;
vertical channel structures in vertical channel holes penetrating the first blocks and in contact with the second substrate;
through-via structures penetrating the second block and the second substrate, and electrically connected to respective ones of the peripheral circuit transistors;
through-via spacers that extend around the through-via structures; and
bit lines that are electrically connected to the vertical channel structures and the through-via structures,
wherein the first separation structures in the stack structure have a uniform pitch in the second direction, and
the second block is spaced apart from the second separation structures in the second direction.

13. The device of claim 12, wherein respective second lengths of the second separation structures in the first direction are less than respective first lengths of the first separation structures in the first direction.

14. The device of claim 12, wherein the second separation structures vertically overlap ones of the vertical channel structures in a third direction, and wherein the second block is free of the second separation structures.

15. The device of claim 12, further comprising a source structure between the second substrate and the stack structure,
wherein the source structure comprises first and second source conductive patterns stacked on the second substrate, and
wherein the first source conductive pattern is spaced apart from the through-via structures with the through-via spacers therebetween.

16. The device of claim 15, wherein the vertical channel structures respectively comprise a data storage pattern on an inner side surface of the vertical channel holes, a vertical semiconductor pattern extending conformally on an inner side surface of the data storage pattern, and a conductive pad on the vertical semiconductor pattern, and
wherein the first source conductive pattern of the source structure is in contact with the vertical semiconductor pattern of the vertical channel structures.

17. The device of claim 12, wherein the second block comprises a plurality of second blocks that are between the first blocks and are spaced apart from each other in the second direction with one of the first separation structures therebetween.

18. The device of claim 12, further comprising an insulating layer on a top surface of the stack structure and in contact with side surfaces of the first separation structures,
wherein the insulating layer comprises bridges that are spaced apart from each other in the first direction with portions of the first separation structures therebetween.

19. An electronic system, comprising:
a three-dimensional semiconductor memory device; and
a controller electrically connected to the three-dimensional semiconductor memory device and configured to control the three-dimensional semiconductor memory device,
wherein the three-dimensional semiconductor memory device comprises:
a substrate;
a stack structure on the substrate, the stack structure comprising first blocks that extend in a first direction and are arranged in a second direction intersecting the first direction, and a second block that is between the first blocks;
separation structures that extend in the first direction and are arranged in the second direction between the first blocks and between the first and second blocks;
vertical channel structures that penetrate the first blocks and contact the substrate;
through-via structures that penetrate the second block and the substrate; and
an input/output pad on the stack structure,
wherein the controller is electrically connected to the three-dimensional semiconductor memory device through the input/output pad, and
wherein a first width of each of the first blocks in the second direction is equal to a second width of the second block in the second direction.

20. The electronic system of claim 19, wherein the three-dimensional semiconductor memory device further comprises:
a peripheral circuit structure below the substrate, and
wherein the through-via structures and the input/output pad are electrically connected to the peripheral circuit structure.

* * * * *